United States Patent [19]

Kawai

[11] Patent Number: 5,717,502
[45] Date of Patent: Feb. 10, 1998

[54] IMAGE READING DEVICE AND INFORMATION PROCESSOR HAVING THE IMAGE READING DEVICE

[75] Inventor: Tatsundo Kawai, Hadano, Japan

[73] Assignee: Canon Kabushiki Kaisha, Tokyo, Japan

[21] Appl. No.: 329,379

[22] Filed: Oct. 25, 1994

Related U.S. Application Data

[63] Continuation of Ser. No. 916,675, Jul. 22, 1992, abandoned.

[30] Foreign Application Priority Data

Jul. 25, 1991 [JP] Japan .................... 3-186397

[51] Int. Cl.⁶ .................... H04N 1/024; H04N 1/04
[52] U.S. Cl. .................... 358/471; 358/482
[58] Field of Search .................... 358/296, 471, 358/474, 475, 482, 483, 496, 505, 509, 510, 513, 514, 529; 348/272; 250/208.1

[56] References Cited

U.S. PATENT DOCUMENTS

| | | | |
|---|---|---|---|
| 3,544,713 | 12/1970 | Case et al. | 250/208.1 |
| 4,482,804 | 11/1984 | Oritsuki et al. | 358/294 X |
| 4,680,644 | 7/1987 | Shirato et al. | 358/294 |
| 4,723,129 | 2/1988 | Endo et al. | 346/1.1 |
| 4,740,796 | 4/1988 | Endo et al. | 346/1.1 |
| 5,101,285 | 3/1992 | Kawai et al. | 358/471 |
| 5,187,595 | 2/1993 | Kitani et al. | 358/482 |
| 5,233,442 | 8/1993 | Kawai et al. | 358/482 |
| 5,272,548 | 12/1993 | Kawai et al. | 358/482 |

Primary Examiner—Eric Frahm
Attorney, Agent, or Firm—Fitzpatrick, Cella, Harper & Scinto

[57] ABSTRACT

An image reading device having a substrate, an array of a plurality of photoelectric conversion elements arranged on the substrate in a main scanning direction, and a plurality of light emission sources arranged in the main scanning direction to emit light for illumination of an original through light transmission windows formed at one side of the photoelectric conversion element array in a sub scanning direction. A shading portion is provided on the photoelectric conversion element side in each light transmission window corresponding to one of the plurality of photoelectric conversion elements to section the light transmission window into a plurality of light transmission regions at least on the photoelectric conversion element side. This image reading device is thus arranged to provide uniform output from the photoelectric conversion elements at the time of reading a black original.

40 Claims, 21 Drawing Sheets

FIG. I
PRIOR ART

IMAGE READING DEVICE AND INFORMATION PROCESSOR HAVING THE IMAGE READING DEVICE

This application is a continuation of application Ser. No. 07/916,675 filed Jul. 22, 1992, which is now abandoned.

BACKGROUND OF THE INVENTION

1. Field of the Invention

This invention relates to an image reading device and an information processor having an image reading device and, more particularly, to an image reading device for use in an input unit for inputting information from an original to information processors, such as facsimile machines, image readers, digital copying machines and electronic blackboards, and an information processor having an image reading device of this kind.

2. Description of the Prior Art

Recently, the demand has increased for image processors, such as image readers, digital copying machines, and electronic blackboards, that are small in size and have improved performance. Now there is a need to further reduce the size of such image information processors and, in particular, their image information reading portions while improving their performance. Close contact type image reading devices are therefore being developed which can be used without a lens optical system or with only a very simple, small optical system.

FIGS. 1 and 2 schematically show an example of an image reading portion of an information processor using a typical one of such image reading devices. FIG. 1 is a schematic cross-sectional view of an array of photoelectric conversion elements of the image reading device viewed in a main scanning direction, and FIG. 2 is a schematic cross-sectional view of the photoelectric conversion element array viewed in a sub-scanning direction.

The image reading device 100 shown in FIGS. 1 and 2 has a transparent substrate formed of a glass plate or the like, photoelectric conversion elements formed on the transparent substrate by a semiconductor manufacturing process, illumination windows, i.e., light transmission portions, capacitors for accumulating signal charges, reading thin-film transistors, and wiring conductors, although these components are not illustrated.

A member 200 is a transparent mount base 200 which is formed of a glass plate or the like, and on which wiring conductors and driving integrated circuit chips are formed by thick film printing, photolithography or the like. The image reading device 100 is bonded to the transparent mount base 200 with an adhesive 500.

A light source 300 is provided which illuminates an original 600. The light source 300 has a light emitting diode (LED) array, i.e., an array of a plurality of LED chips and, if necessary, has a bar lens.

Illumination light L from the light source 300 passes through the transparent mount base 200 and the illumination windows in the image reading device 100 to irradiate the original 600. Information light reflected by the original 600 is received by the photoelectric conversion elements of the image reading device 100 and is converted into an electrical signal which is output as an image signal.

FIG. 3 is a plan view of a portion of the image reading device 100 having a plurality of photoelectric conversion units each having a photoelectric conversion element region 101, a capacitor region 201, thin-film transistor regions 301 and 401, and matrix wiring regions 501 and 601.

As shown in FIG. 3, each photoelectric conversion element 3101 has a lower electrode 108 which serves as a film for shading light introduced through the substrate. Irradiating light on the substrate side passes through a lighting window 7 and is reflected by the original surface (not shown) located above in the direction perpendicular to the plane of projection of FIG. 3. Scattered light of this reflection is introduced into the photoelectric conversion element 3101. A photoelectric current of carriers generated by introducing light into the photoelectric conversion element 3101 flows into an accumulation capacitor 3201 to accumulate a charge. The accumulated charge is output to the signal line matrix wiring section 501 by a transfer thin-film transistor 3301 to be supplied to a signal processing unit (not shown).

A resetting thin-film transistor 3401 functions to release a residual charge in the capacitor 3201 after the charge transfer to reset the capacitor value to the initial value.

FIG. 4 is a schematic enlarged diagram of a portion of the image reading device including photoelectric conversion elements 3101 and lighting windows 7 shown in FIG. 3. Each lighting window 7 consists of a portion 7a adjacent to one photoelectric conversion element 3101 in a sub scanning direction and a portion 7b adjacent to the same photoelectric conversion element in a main scanning direction. In FIG. 4, a photoconductive layer 3102, a layer of amorphous silicon or the like is illustrated.

FIG. 5 is a schematic cross-sectional view of the photoelectric conversion element array of the image reading device taken along the line P-P' of FIG. 4. Photoelectric conversion elements 3101 and lighting windows 7b are alternately arranged along the line P-P' of FIG. 4; schematically, non-transparent portions having a light receiving sensitivity and transparent portions having no light receiving sensitivity are alternately arranged. In FIG. 5, the photoelectric conversion elements 3101 are shown as light sensing portions 9 and the lighting windows 7b are shown as spacings between light sensing portions 9. The width of the light sensing portions 9 is substantially equal to a distance Ws, and the width of the light transmission spacings between the light sensing portions 9 is substantially equal to a distance Wb.

FIG. 6 is a schematic diagram of an output characteristic of the thus-constructed image reading device, i.e., the values of output signals from the photoelectric conversion elements 3101 with lighting windows 7 with respect to the plurality of discretely-arranged LED chips of the LED array used as a light source. The number of the LED chips is smaller than the number of the photoelectric conversion elements.

In the above-described image reading device, an image signal output (a) obtained when a white original is read is generally uniform through the entire original length, but an image output (b) obtained when a black original is read varies greatly in large cycle corresponding to the LED chip arrangement pitch, as shown in FIG. 6. That is, a problem of a deterioration in image quality is encountered.

The deterioration in image quality caused by such variation in the output signal at the time of reading a black original is considerably large when the image is read in a high-precision reading or high-precision half-tone reading manner.

SUMMARY OF THE INVENTION

The present invention has been achieved in consideration of the above-described problem, and an object of the present invention is to provide a low-cost image reading device for use in a close-contact type image reader using a pseudo linear light source such as an LED array which image reading device is capable of removing non-uniformity of an image signal output with accuracy at the time of reading a black original, and which device is suitably used for high-precision half-tone reading.

Another object of the present invention is to provide an image reading device capable of adjusting the level of signal outputs from photoelectric conversion elements so that the ratio of the levels of a signal output obtained by reading a white original and a signal output obtained by reading a black original is constant or substantially constant irrespective of the position of photoelectric conversion elements and, preferably, so that the signal outputs from the photoelectric conversion elements are equal or substantially equal at the time of reading a white (or black) original, and to provide an information processor having such an image reading device.

Still another object of the present invention is to provide an image reading device designed to solve the above-described problem at a low cost (or without any substantial increase in manufacturing cost) and to meet design requirements with respect to size and power consumption, and an information processor having such an image reading device.

To achieve these objects, in one aspect of the invention, there is provided an image reading device comprising an array of photoelectric conversion elements, a plurality of windows having original illumination aperture regions arranged along the array of photoelectric conversion elements, and a shading region formed in each of the aperture regions of the windows in a direction across the direction in which the windows are arranged along the array of photoelectric conversion elements.

According to another aspect of the invention, an image reading device is provided comprising an array of photoelectric conversion elements, a plurality of windows having original illumination aperture regions arranged along the array of photoelectric conversion elements, and original illumination light sources arranged discretely. A shading region is formed in each of the aperture regions in a direction across the direction in which the windows are arranged along the array of photoelectric conversion elements so that light emitted from the light sources and specularly reflected by a surface of an original is equally or substantially equally incident upon light receiving portions of said photoelectric conversion elements.

According to a further aspect of the present invention, an information processor is provided comprising an image reading device having an array of photoelectric conversion elements and a plurality of windows having original illumination aperture regions arranged along said array of photoelectric conversion elements. A means for transporting an original is also provided, and a shading region is formed in each of the aperture regions of the windows in a direction across the direction in which said windows are arranged along the array of photoelectric conversion elements.

According to yet a further aspect of the present invention, an information processor is provided comprising an image reading device having an array of photoelectric conversion elements, a plurality of windows having original illumination aperture regions arranged along the array of photoelectric conversion elements, and original illumination light sources arranged discretely. A shading region is formed in each of the aperture regions in a direction across the direction of the array of photoelectric conversion elements so that light emitted from said light sources and specularly reflected by a surface of an original is equally or substantially equally incident upon conversion element. And a means for transporting an original is also provided.

According to still a further aspect of the present invention, an image reading device is provided comprising a substrate, an array of photoelectric conversion elements arranged on the substrate in a main scanning direction, and an illumination means having a plurality of light sources arranged in the main scanning direction to emit light for illumination of an original through light transmission portions formed at one side of the photoelectric conversion element array in a sub scanning direction. A shading portion is provided on the photoelectric conversion element side in one of said photoelectric conversion elements to section the light transmission regions at least on the photoelectric conversion element side.

According to yet another aspect of the present invention, an information processor is provided comprising an image reading means including a substrate, an array of photoelectric conversion elements arranged on the substrate in a main scanning direction, and illumination means having a plurality of light emission sources arranged in the main scanning direction to emit light for illumination of an original through light transmission portions formed at one side of the photoelectric conversion element array in a sub scanning direction. A shading portion is provided on the photoelectric conversion element side in each light transmission portion corresponding to one of said photoelectric conversion elements to section the light transmission portion into a plurality of light transmission regions at least on the photoelectric conversion element side. Original support means are provided for retaining an original at a reading position, and signal processing means are provided for processing a signal output from said image reading means.

According to still another aspect of the present invention, an image reading device for use with a light source is provided comprising a plurality of photoelectric conversion elements and a plurality of illumination aperture regions adjacent to each of the photoelectric conversion elements and configured so that light transmitted through the aperture regions and specularly reflected in a position of an original is equally or substantially equally incident upon light receiving portions of said photoelectric conversion elements.

The shading region may be defined by using wiring of the image reading device, shading portions of the photoelectric conversion elements, or other shading members.

The width of the shading region in the direction of the array of photoelectric conversion elements is equal or substantially equal to the width of a frame portion constituting each window (the area in which a shading member is disposed between each adjacent pair of windows). If the frame portion is not one member but is formed of a plurality of members, the width of the shading region in the direction of the array of photoelectric conversion elements may be set to a value equal or substantially equal to the sum of the widths of the plurality of members. If in this case the gaps between the plurality of members are very small and negligible as light transmission regions in practice, the width of the shading region may be set to a value equal or substantially equal to the overall width of the group of the plurality of members including these gaps.

The shading region provided in each aperture is formed so as to project inwardly at least from one side of the window at which a corresponding one of the photoelectric conversion elements is formed. It is not necessary for the shading portion to be formed so as to connect two sides of the window.

As described later, the shading region may be formed by considering the positional relationship between discretely arranged LEDs and the windows so that light specularly reflected by the original is equally or substantially equally incident upon light receiving portions (sensing portions) of the photoelectric conversion elements.

Even in a case where the plurality of windows are formed by shading members which are provided only to form the windows and which do not function as other kinds of members, e.g., wiring conductors, the width of the shading region may be set to be equal or substantially equal to the width of each of the shading portions between the windows corresponding to one photoelectric conversion element. This is because the area of the shading portion corresponding to a part of the sensing portion of each photoelectric conversion element may be set in accordance with the above-described shading region.

DESCRIPTION OF THE PREFERRED EMBODIMENTS

The present invention will be described in detail with reference to the accompanying drawings.

The reason for the occurrence of the above-mentioned phenomenon of variation in a signal output will be first described briefly.

FIGS. 7(A), 7(B), 8(A), and 8(B) are schematic diagrams of rays of light L which is emitted from LEDs to irradiate original 6 and is reflected by original 6 to be incident upon photoelectric conversion elements 3101.

Figure 7A:
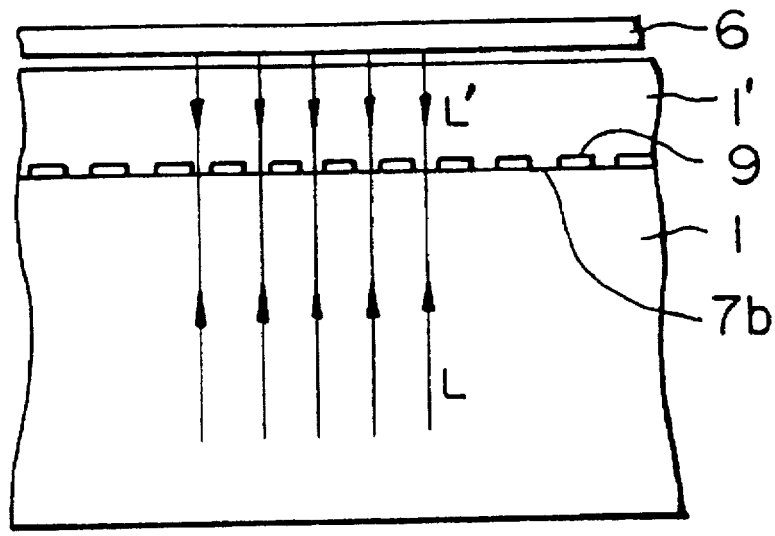
FIGS. 7(A), 7(B), 8(A), and 8(B) are schematic diagrams of states of illumination light in the image reading device.
Figure 7B:
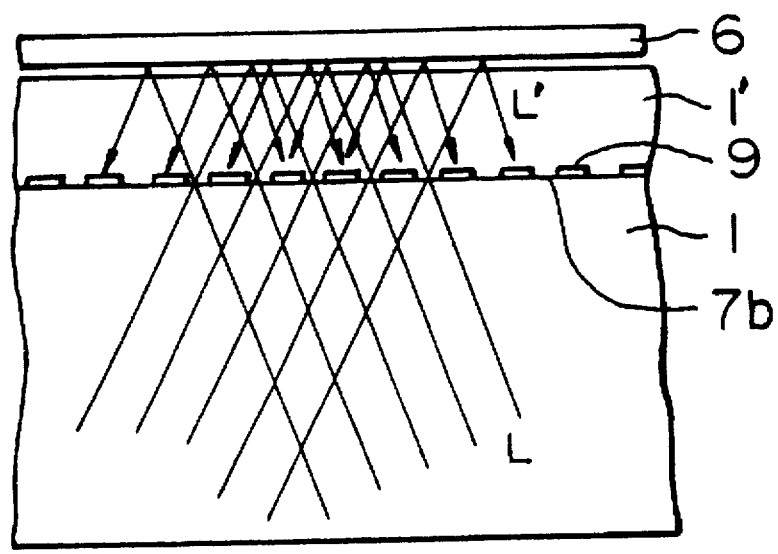

FIG. 7(A) schematically shows the state of light incident upon photoelectric conversion elements positioned right above one LED chip when a black original is read by the reader. FIG. 7(B) schematically shows the state of light incident upon photoelectric conversion elements right above the spacing between one adjacent pair of LED chips when the same original is read.

Figure 8A:
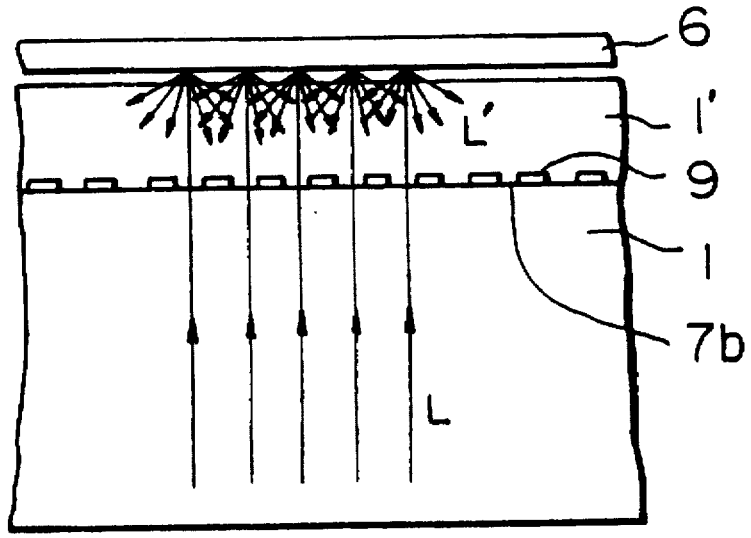
Figure 8B:
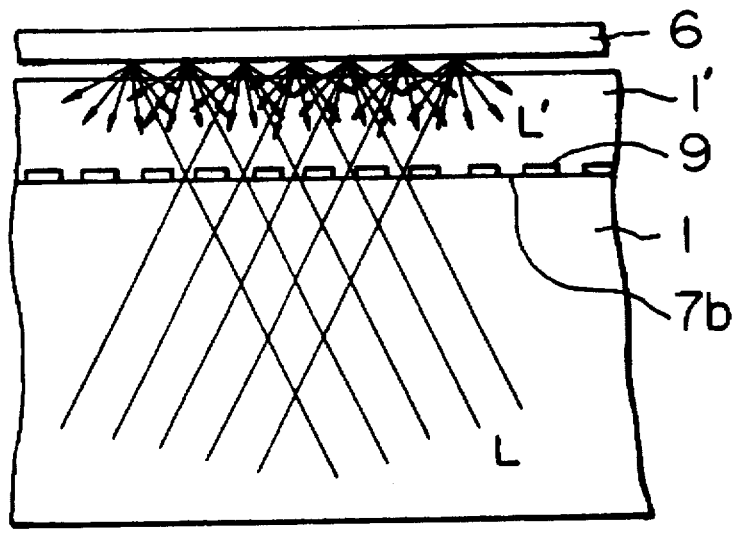

FIG. 8(A) schematically shows the state of light incident upon photoelectric conversion elements positioned right above one LED chip when a white original is read by the reader. FIG. 8(B) schematically shows the state of light incident upon photoelectric conversion elements right above the spacing between one adjacent pair of LED chips when the same original is read.

In these figures, transparent sensor substrate 1, protective layer 1' provided on the sensor substrate, original 6, sensing portions 9 of the photoelectric conversion elements 3101, lighting windows 7b, illumination light L and reflected light L' are illustrated.

Ordinarily, a black original is made by printing black ink on a white paper sheet and reflection on the surface of such a black original is generally specular reflection. In the surface of a white paper sheet, small irregularities are formed by paper fibers and additives, that is, a scattering surface is formed. Incident light is thereby reflected in a diffuse reflection manner. In contrast, in a black print portion, the paper surface is covered with black ink so that small irregularities are reduced, and light incident upon such a black portion is therefore reflected specularly.

Accordingly, as shown in FIG. 7(A), at the positions right above the LED chip, illumination light L passing through the lighting windows of the transparent sensor substrate 1 illuminates original 6 by traveling generally perpendicularly to the original, so that reflected light L' from the original travels to the outside by passing through the lighting windows again.

On the other hand, as shown in FIG. 7(B), at the positions right above the spacing between the adjacent LED chips, reflected light from the original can be incident upon the photoelectric conversion elements.

In the case of a white original, reflection on the original surface is generally diffuse reflection, so that reflected light can be incident upon the photoelectric conversion elements no matter what the relative positions of the light receiving elements and the LED chips, as shown in FIGS. 8(A) and 8(B).

Thus, non-uniformity of the image signal output occurs when a black original is read, even though the image signal output is uniform when a white original is read.

This problem is a typical technical problem of a method of combining a light source, such as an LED array, in which a plurality of light emission sources are discretely arranged to obtain a uniform illuminance over the surface of the original, and a photoelectric conversion device for directly sensing reflected light from the original without using any lens array. Image readers using a completely linear light source such as a fluorescent lamp are free from this kind of problem.

However, a light source such as a fluorescent lamp has a large outside size, entails a risk of being damaged, and requires application of an AC voltage, in some cases a high-voltage high-frequency AC voltage converted from a DC voltage. Therefore it cannot be suitably reduced in manufacturing cost and size.

It is also possible to solve the above-described problem by providing LED chips in a one-to-one relationship with photoelectric conversion elements. However, the requirements for low-cost low-power-consumption design cannot be satisfied by this method.

Figure 1:
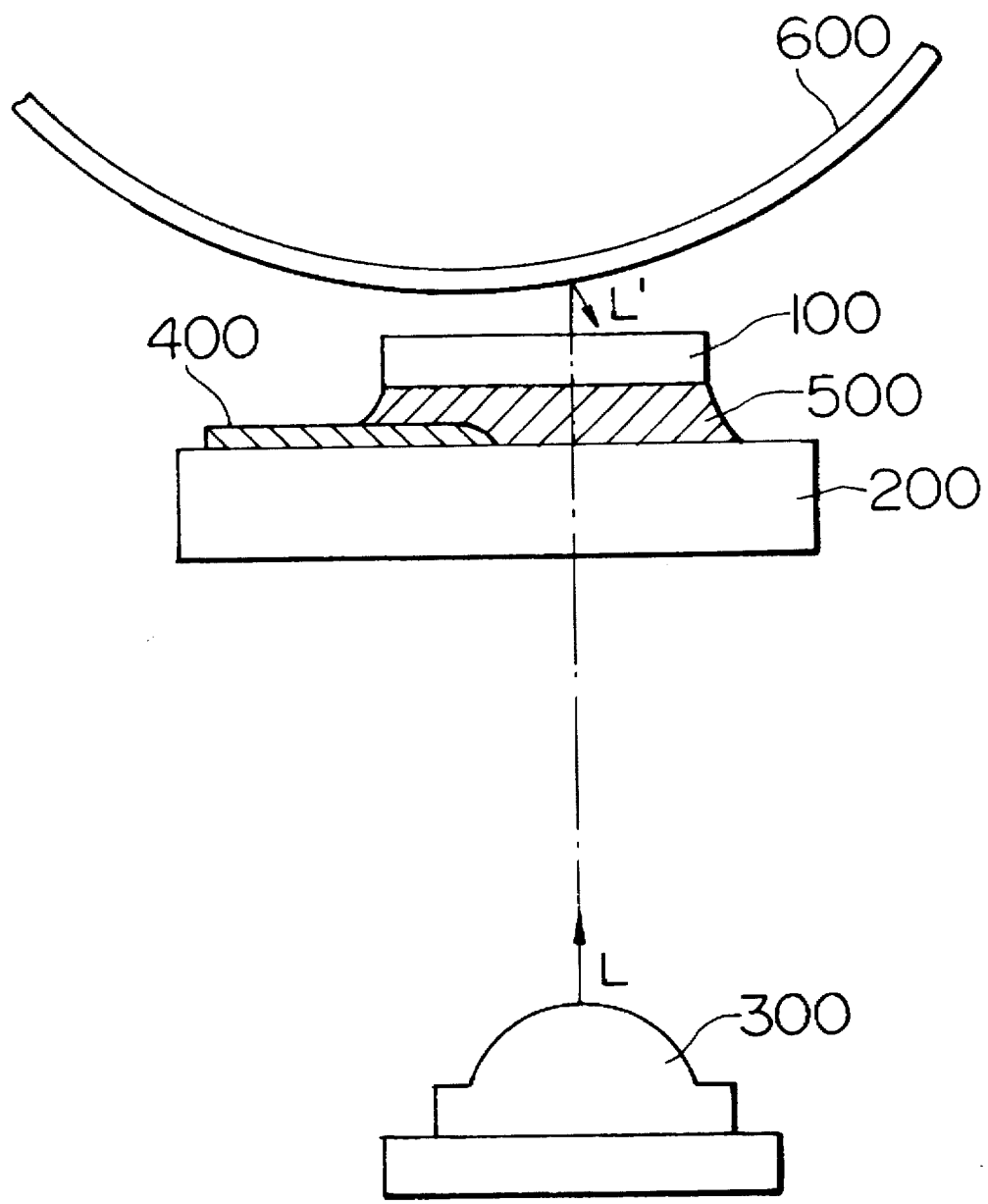
FIG. 1 is a schematic cross-sectional view of a conventional image reading device viewed in a main scanning direction.
Figure 2:
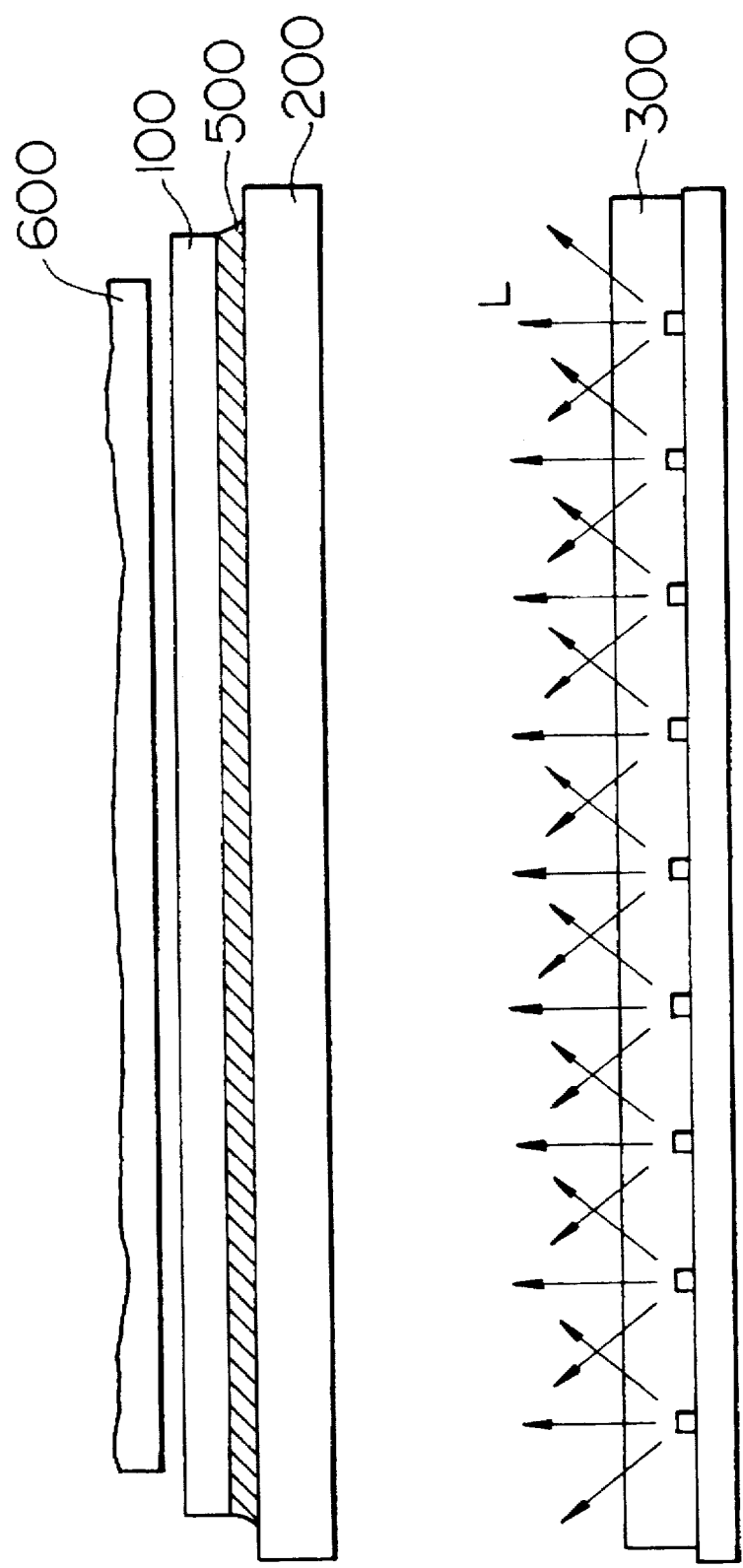
FIG. 2 is a schematic cross-sectional view of the conventional image reading device viewed in a sub-scanning direction.
Figure 3:
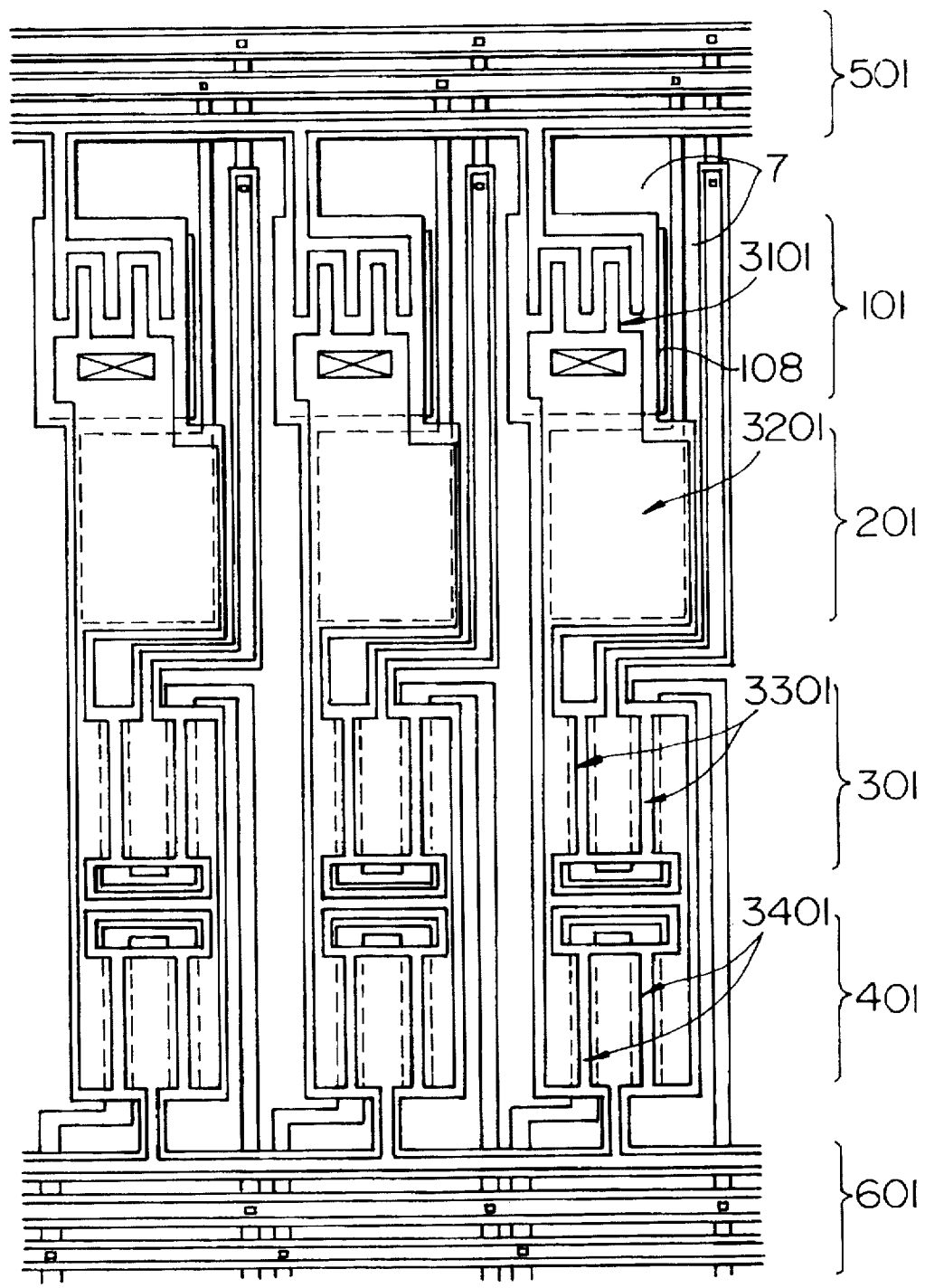
FIG. 3 is a schematic top view of the conventional image reading device.
Figure 4:
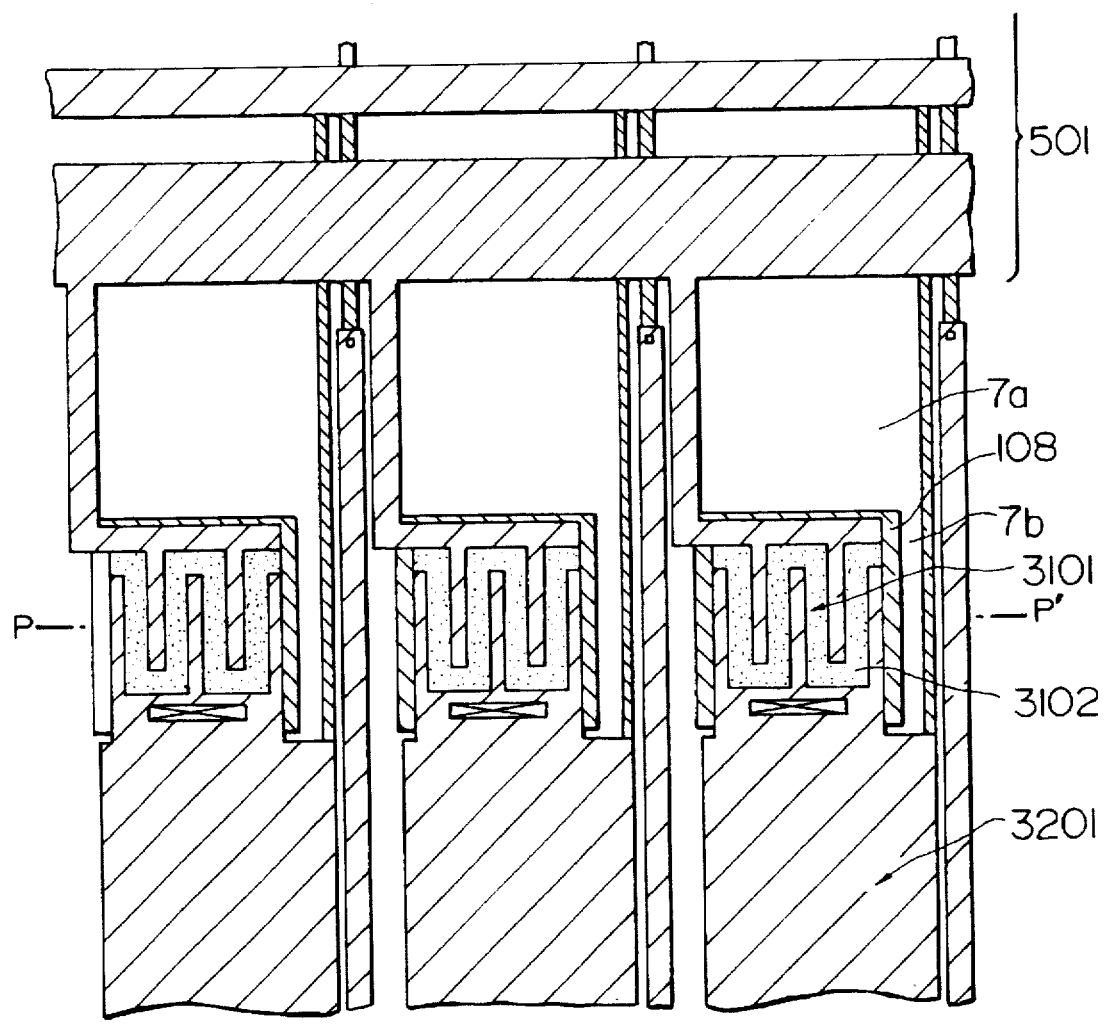
FIG. 4 is a schematic enlarged view of a portion of the image reading device shown in FIG. 3.
Figure 5:
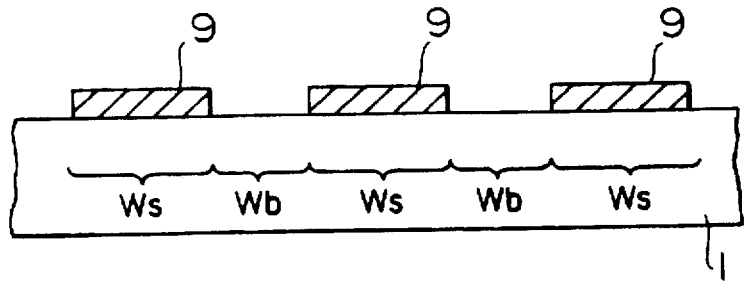
FIG. 5 is a schematic cross-sectional view of light transmission portions of the image reading device.

It can be considered that non-uniformity of the image signal output at the time of reading a black original is caused mainly because the photoelectric conversion elements and the lighting windows are alternately arranged in the main scanning direction so that the amount of light specularly reflected by the original to be incident upon each sensing portion changes according to the angle of bundles of rays from the light source. It may be supposed that the extent of this change can be reduced if portions of the windows shown in FIG. 4, in particular, the portions 7b adjacent to the photoelectric conversion elements in the main scanning direction are shaded.

Figure 9:
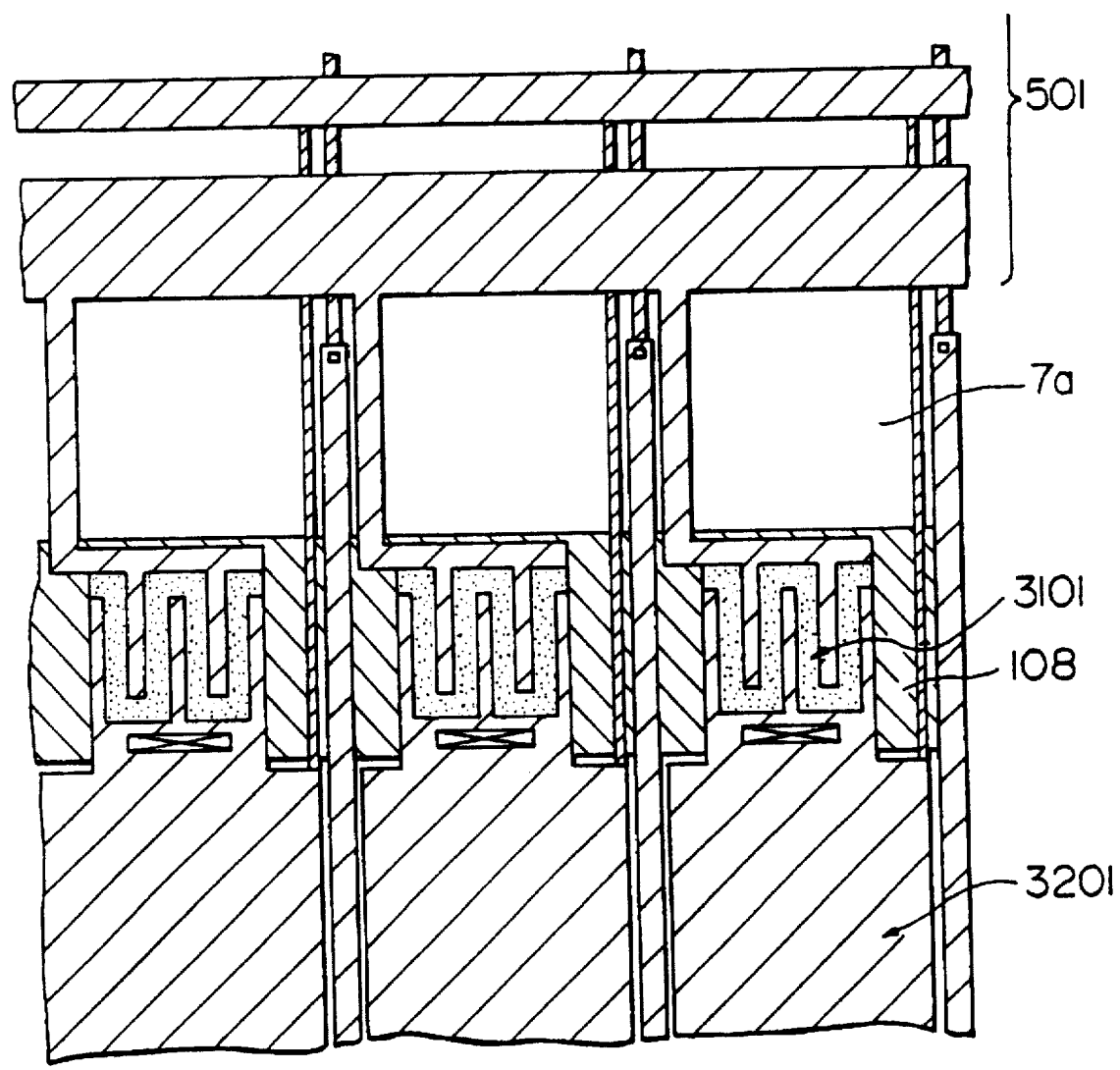
FIG. 9 is a schematic top view of another example of the construction of the image reading device.

FIG. 9 is an enlarged diagram of photoelectric conversion elements and portions surrounding these elements of an example of an image reading device improved by providing such a shading. In the arrangement shown in FIG. 9, each lower electrode 108 serving as a shading film is extended to the right and left to close and shade the window 7b almost completely.

Figure 6:
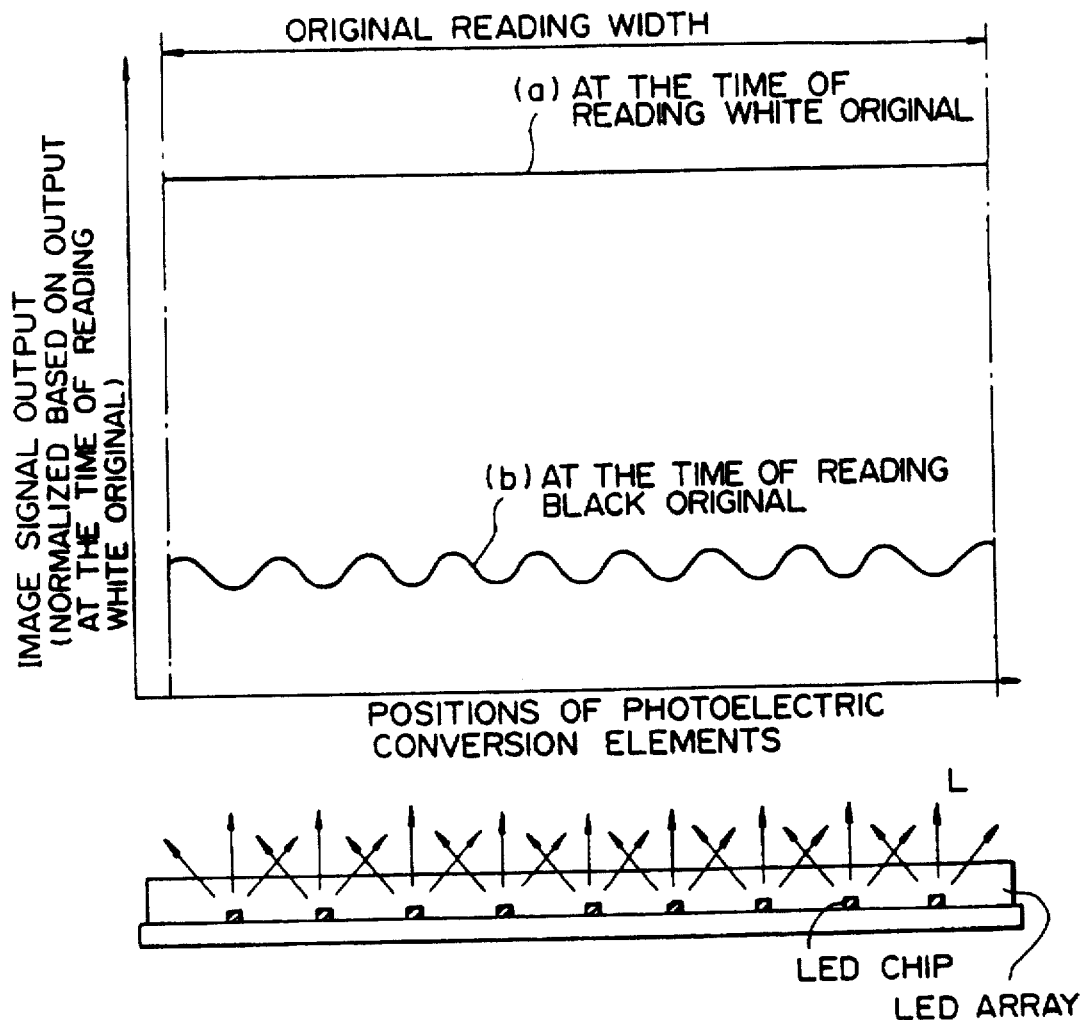
FIG. 6 is a schematic diagram of signal outputs from the image reading device.
Figure 10:
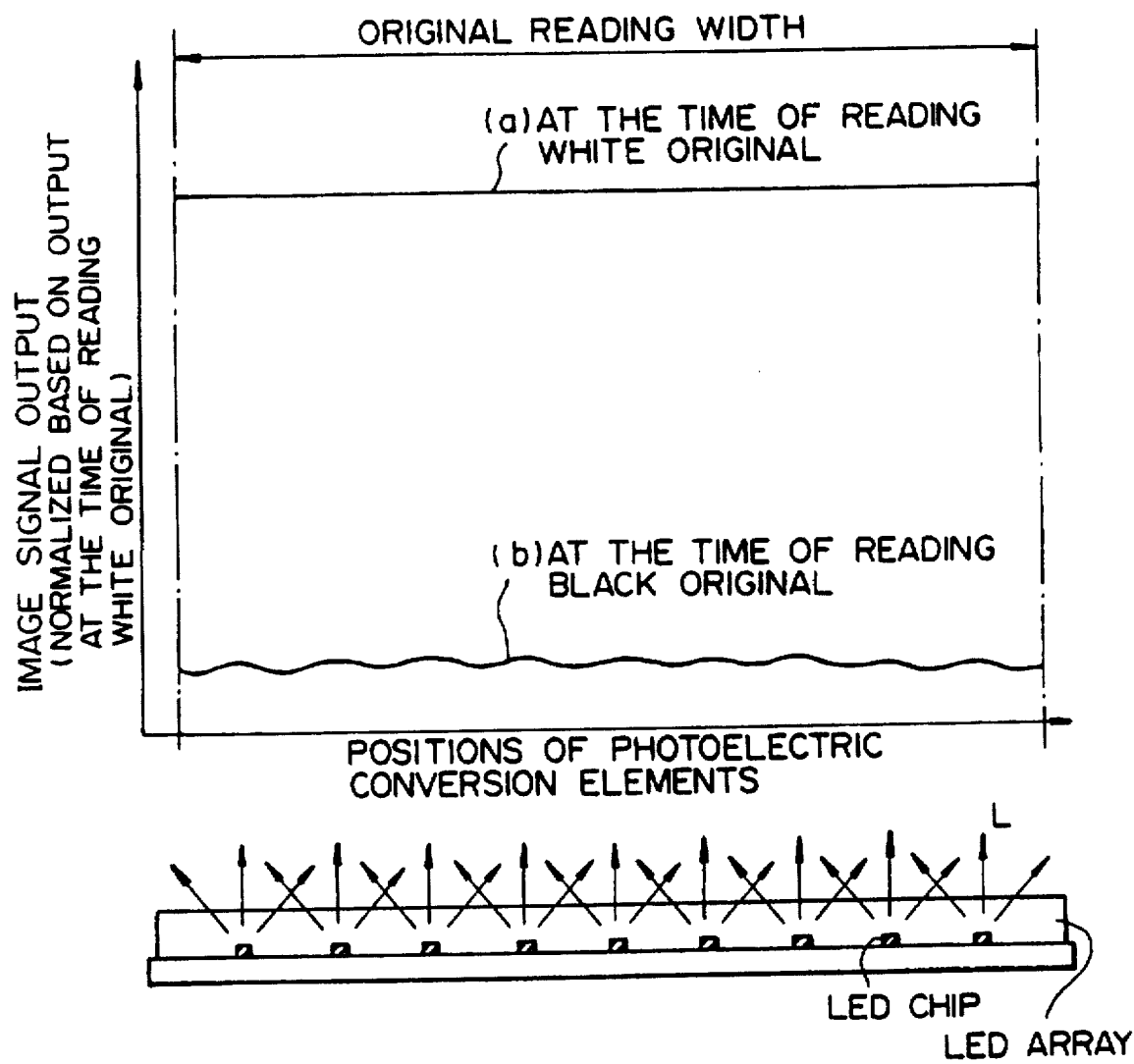
FIG. 10 is a schematic diagram of signal outputs from the image reading device shown in FIG. 9.

FIG. 10 shows an image signal output from this image reading device. The signal output at the time of reading a black original is generally low and the extent of non-uniformity is limited in comparison with the signal output from the image reading device unimproved (FIG. 6). Non-uniformity still remaining recurs in a cycle the phase of which is different from that of the non-uniformity shown in FIG. 6 caused by the above-described mechanism, that is, the output level is slightly high at the position right above each LED chip and is slightly low at the position right above the spacing between each adjacent pair of LED chips. The non-uniformity of this image reading device is caused by bundles of rays passing through the windows 7a adjacent to the photoelectric conversion elements in the sub scanning direction. To examine the mechanism of generation of this non-uniformity, an image 7c projected onto a surface of the image reading device facing the original (hereinafter referred to as "sensor surface") by bundles of rays passing through each window 7a and thereafter reflected specularly by the surface of the black original will be considered.

Figure 11:
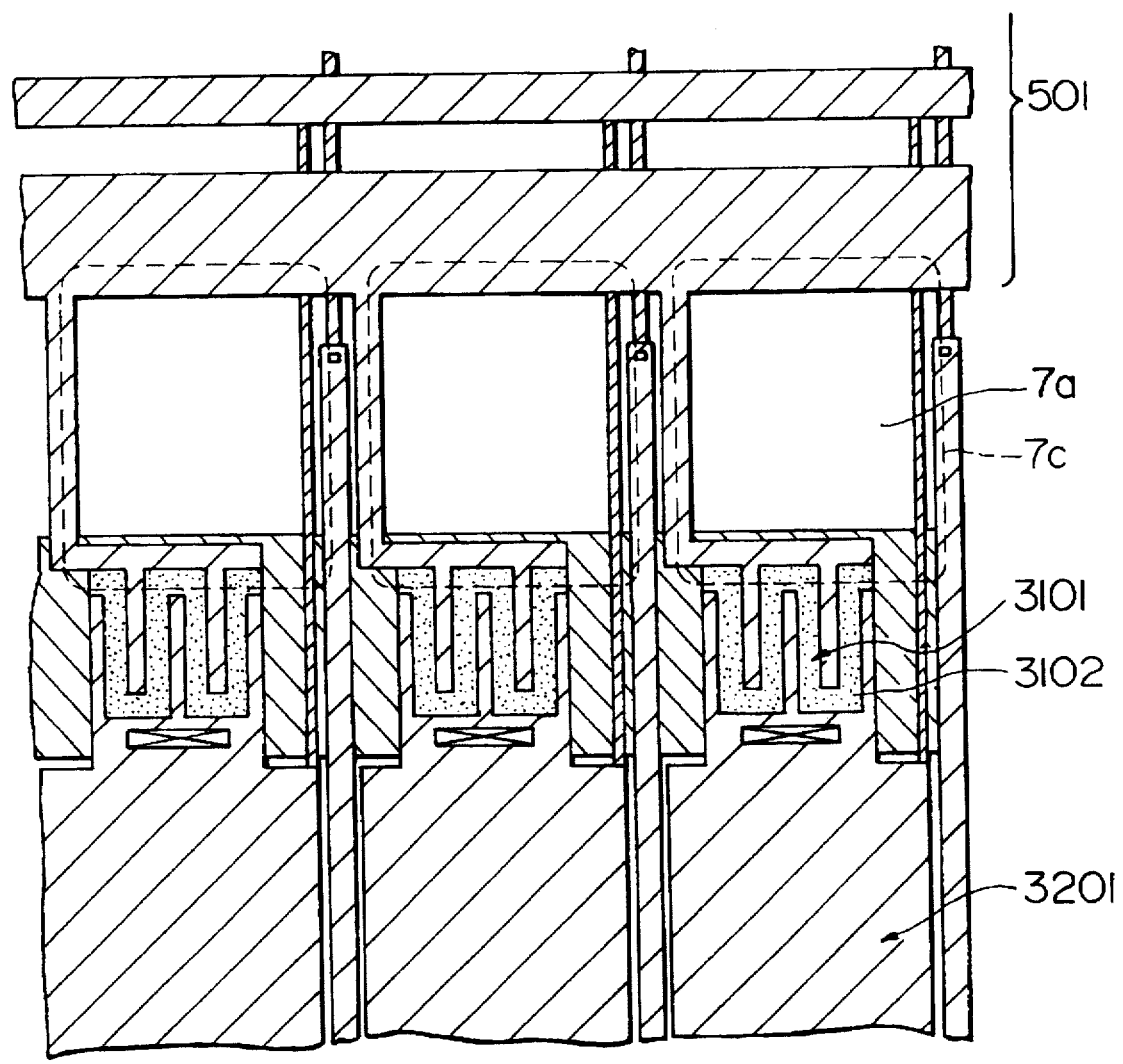
FIGS. 11 to 13 are schematic diagrams of images of the light transmission portions projected at the time of reading a black original in the image reading device.

In FIG. 11, the image 7c of each window formed at a position right above one LED chip in this manner is indicated by a broken line. Bundles of rays generated from the LED chip right below are perpendicularly led to the windows 7a. The bundle of rays passing through each window is specularly reflected by the black original surface not shown in FIG. 11 and travels perpendicularly through the window again. However, it expands to some extent by the diffraction effect and the effect of the substantially large area of the LED chip to form the image 7c on the sensor surface as indicated by the broken line.

The window image 7c overlaps the area of the sensing portion 9 of the photoelectric conversion element 3101 to cause a certain output from the photoelectric conversion element. The output at the time of reading the black original is thus obtained.

That is, a part of the window image 7c is formed on the photoconductive layer 3102 forming the light sensing portion 9 having a zigzag shape (the shape of W in the example shown in FIG. 11) illustrated as a dotted area in FIG. 11. A certain output is therefore produced even though the original is black.

Figure 12:
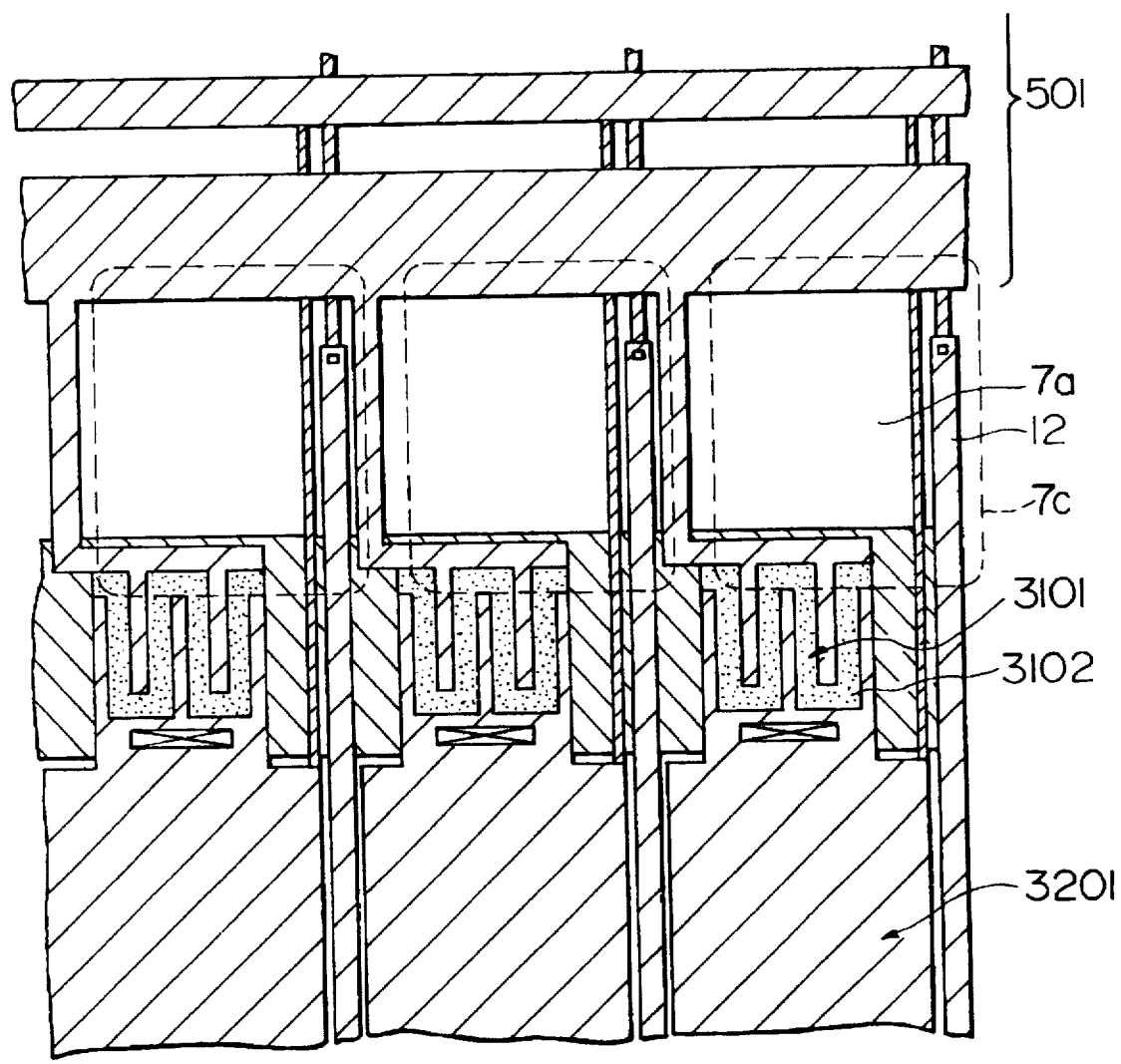

FIG. 12 shows the formation of image 7c at a position slightly deviated from the position right above one LED chip. In this case, a bundle of rays emitted from the LED chip is led to each window 7a slightly obliquely, so that the window image 7c is slightly shifted in the main scanning direction. Therefore the shade of the non-transparent portion formed of, e.g., a signal line, overlaps the sensing portion of the photoelectric conversion element, so that the output is smaller than that obtained when the window is located right above the LED chip (i.e., the output in the case illustrated in FIG. 11).

Figure 13:
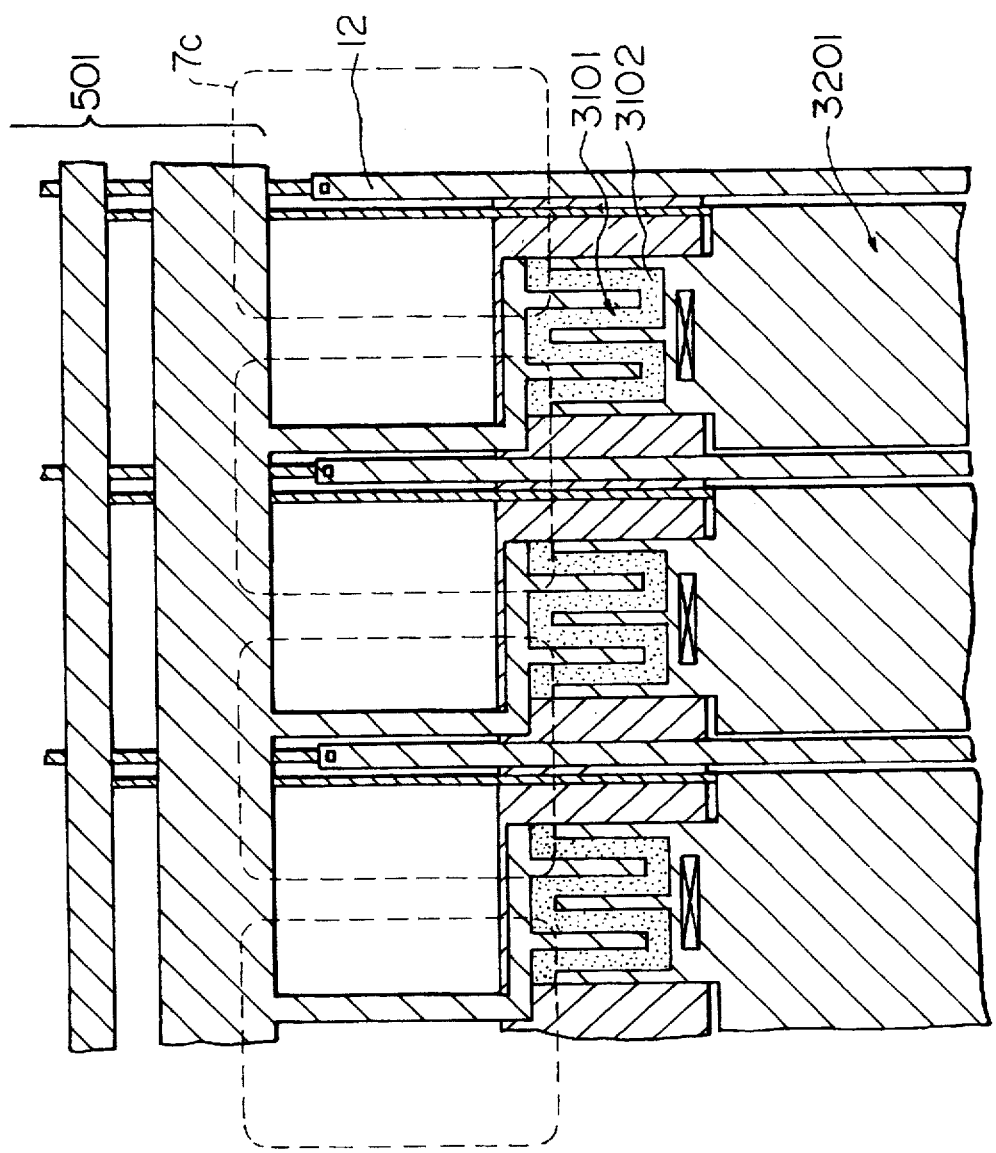

FIG. 13 shows the formation of image 7c at a position right above the spacing between an adjacent pair of LED chips. In this case, the influence of the shade of the signal line is further increased; the shape of the signal line covers a larger part of the area of the photoconductive layer 3102 forming the sensing portion 9, so that the output is minimized.

By this mechanism, a small extent of non-uniformity remains even in the image reading device in which the window portion 7b adjacent to each photoelectric conversion element in the main scanning direction is shaded and only window 7a adjacent in the sub scanning direction is open.

Although the extent of this non-uniformity is small, a considerable deterioration in image quality is caused in the case of a high-precision half-tone reading, as mentioned above.

To solve this problem, the distance between the windows and the sensing portions may be increased, as mentioned above. However, the quantity of light introduced to the sensing portions is thereby reduced and, therefore, this method is not basically effective.

The present invention has been made to achieve the above-mentioned objects by sufficiently considering these problems.

Figure 14:
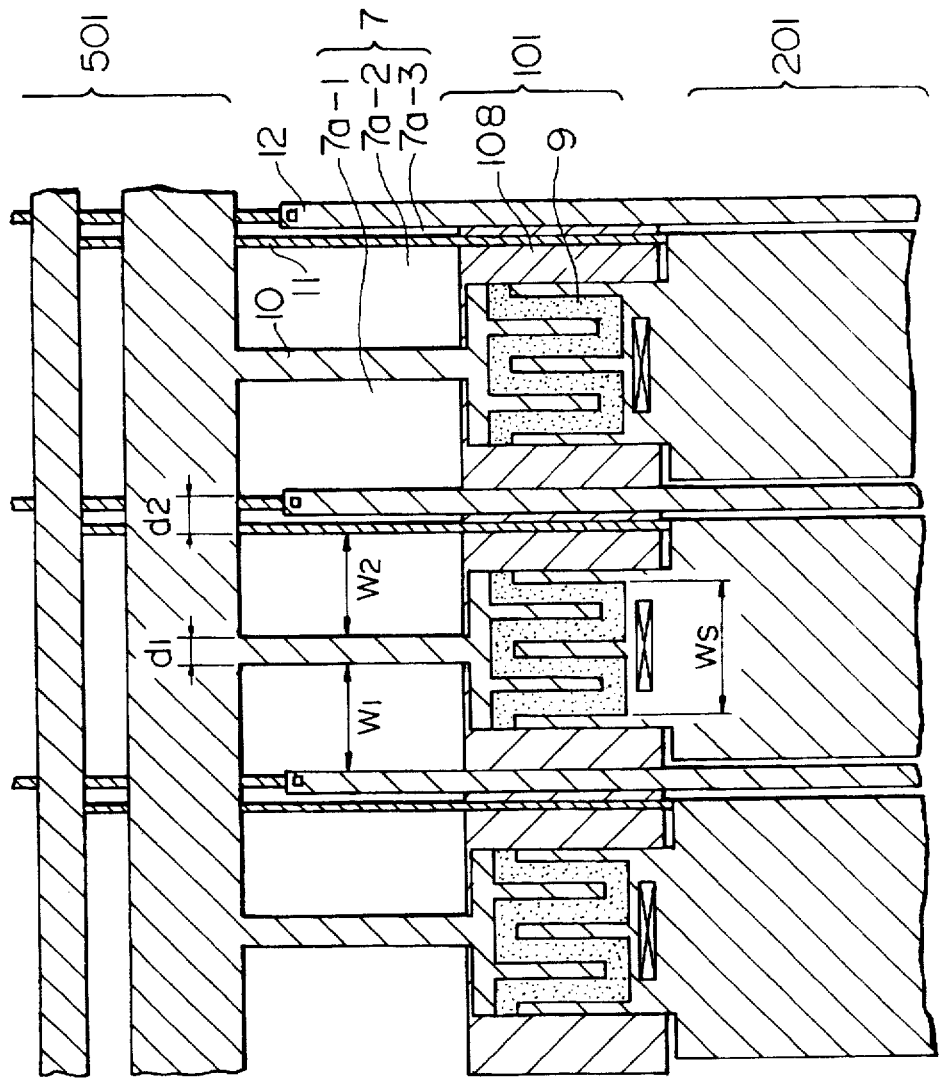
FIG. 14 is a schematic top view of a preferred image reading device in accordance with the present invention.

FIG. 14 is an enlarged diagram of photoelectric conversion elements formed on a sensor substrate, a light transmission portion of the sensor substrate and other components around them in accordance with an embodiment of the present invention. FIG. 14 illustrates a region 101 of a photoelectric conversion element array, signal accumulation capacitors 201, lighting windows 7, i.e., light transmission portions, lower electrodes 108 which serve as electrodes of thin-film-transistor (TFT) type photoelectric conversion elements and also serve as a shading film, light sensing portions 9 of photoelectric conversion elements 3101, source electrodes 10 for applying a bias voltage to the photoelectric conversion elements, leads 11 extending from lower electrodes of capacitors 201, and signal lines 12 for outputting signal charges accumulated in the capacitors through an unillustrated signal line matrix.

The lighting windows 7 are formed adjacent to the photoelectric conversion elements in the sub scanning direction. In this embodiment, each lighting window 7 is formed of three light transmission regions 7a-1, 7a-2, and 7a-3 for each photoelectric conversion element by electrodes 10, 11, and 12 forming the signal line and so on. The region 7a-3 is very narrow in comparison with the regions 7a-1 and 7a-2, and the part of the output signal ascribed to the region 7a-3 is negligible in terms of signal processing.

In this embodiment, the closed window areas 7a-1 and 7a-2 have approximately equal widths $W_1$ and $W_2$ in the main scanning direction, and each of the width $W_1$ and $W_2$ is set to a value close to the width Ws of the sensing portions 9.

The regions 7a-1 and 7a-2 constituting one window 7 are separated by the source electrode 10 defining a shaded region at one side of the region 7a-1 or 7a-2, and are each separated from the region 7a-1 or 7a-2 constituting one adjacent window 7 by a pair of lead conductor 11 and signal line conductor 12 disposed close to each other.

The width $d_1$ of each source electrode and the width $d_2$ of each pair of lead conductor 11 and signal line conductor 12 are set to approximately equal values.

Each of portions adjacent to the photoelectric conversion elements 3101 in the main scanning direction is sufficiently shaded by enlarging the photoelectric conversion element lower electrode 108 having the function of a shading film. The lower electrodes 108 are separated under signal line conductors 12 or electrically insulated from signal lines 12 by interposing insulating layers therebetween.

Figure 15:
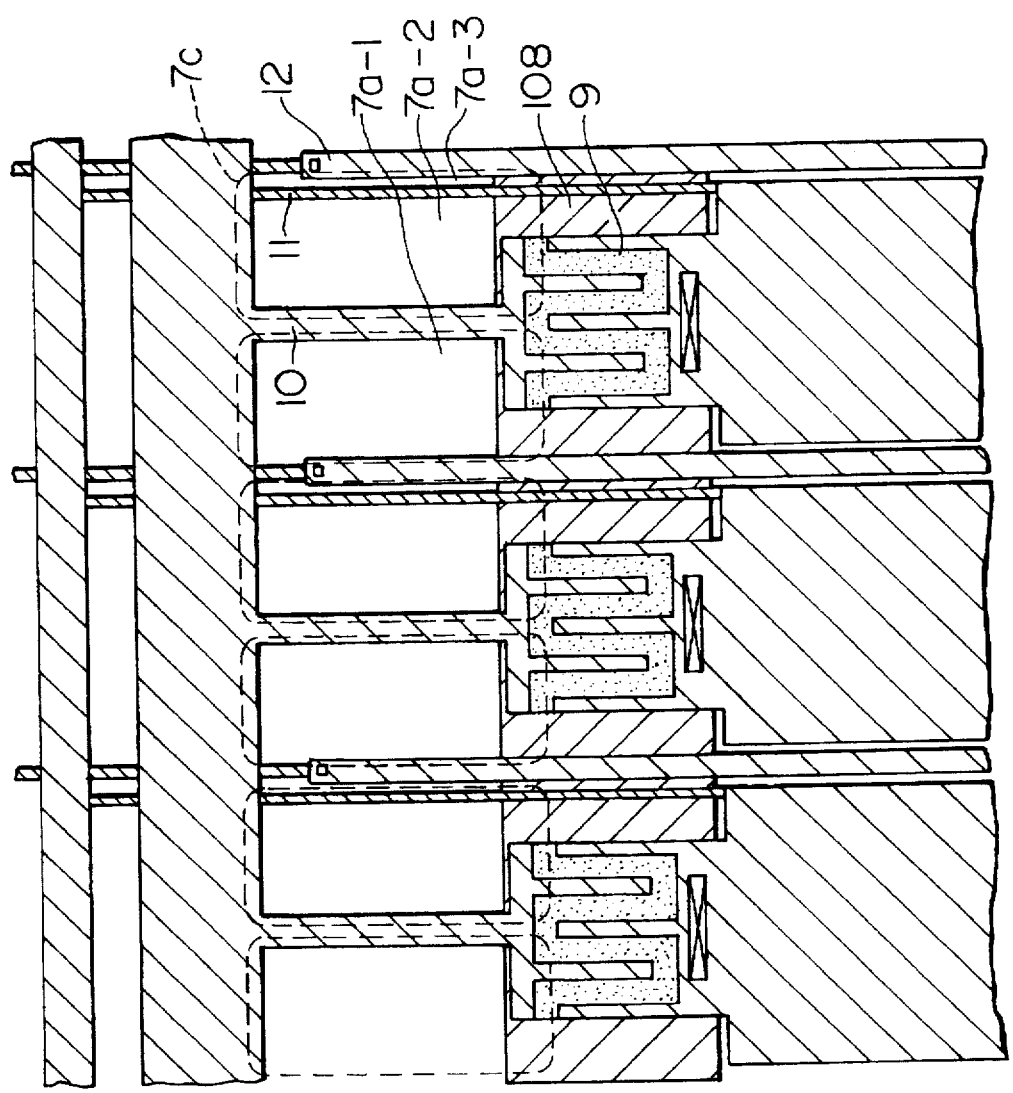
FIGS. 15, 16, and 17 are schematic diagrams of images of the light transmission portions projected at the time of reading a black original in the image reading device of the present invention.

Each of areas encircled by broken lines in FIG. 15 represents an image 7c of the window projected onto the sensor surface at a position right above one LED chip in accordance with this embodiment. Each window image slightly extended by diffraction and other causes overlaps the sensing portion 9 of the corresponding photoelectric conversion element 3101. The shades of lead conductors 11 and signal line conductors 12 do not overlap the sensing portions 9 and do not influence the signal output, but the shades of source electrodes 10 overlap the sensing portions 9 to slightly reduce the signal output.

Figure 16:
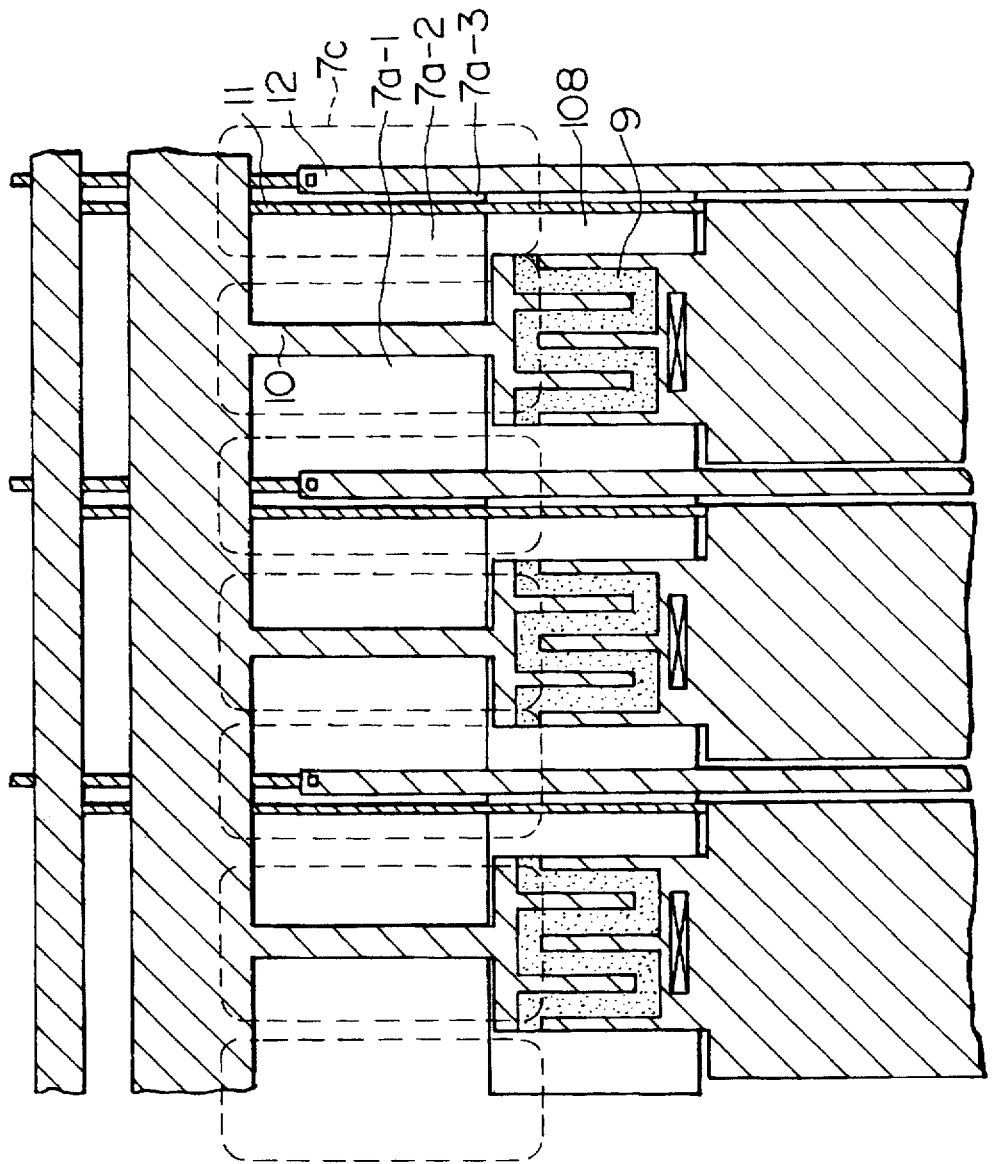

FIG. 16 shows the formation of image 7c at a position slightly deviated from the position right above one LED chip. The shades of lead conductors 11 and signal line conductors 12 slightly overlap the sensing portions 9 while the overlapping area of the shade of each source electrode 10 on the sensing portion 9 is reduced. The influence of the shades upon the signal output as a whole is the same as the case shown in FIG. 15.

Figure 17:
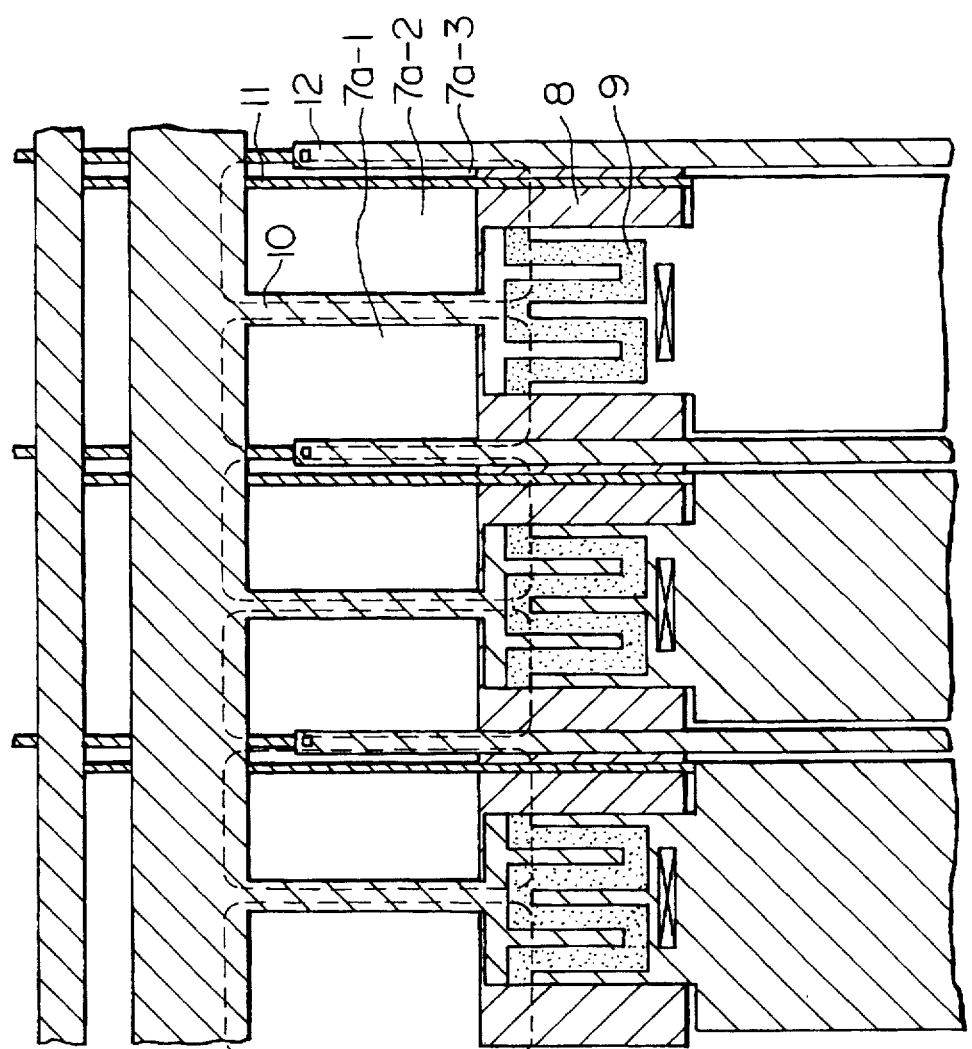

FIG. 17 shows the formation of image 7c at a position right above the spacing between each adjacent pair of LED chips. The shades of lead conductors 11 and signal line conductors 12 overlap the sensing portions 9 but the shades of source electrodes 10 do not overlap the sensing portions 9. Therefore the influence of the shades upon the signal output as a whole is the same as the case shown in FIG. 15.

Figure 18:
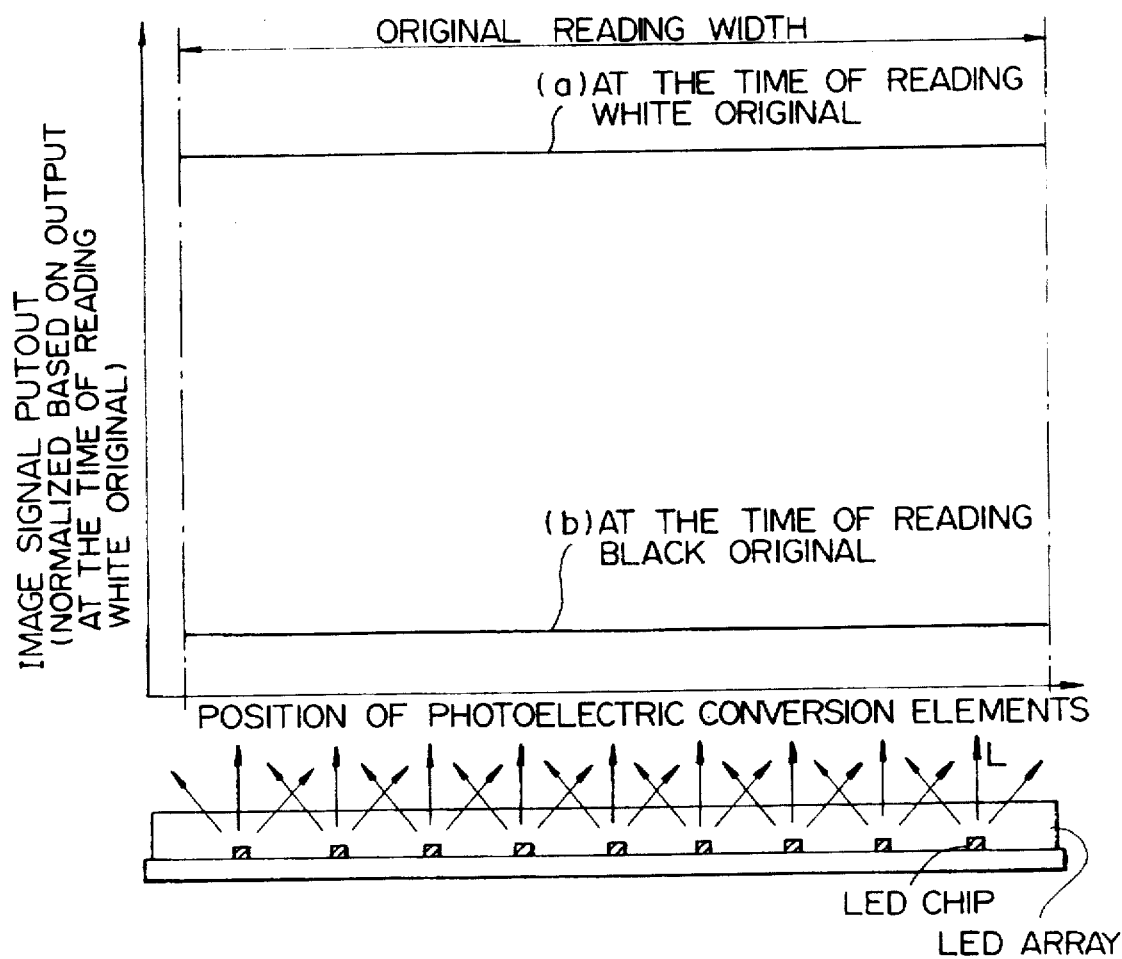
FIG. 18 is a schematic diagram of signal outputs from the image reading device of the present invention.

FIG. 18 shows image signal outputs obtained by reading white and black originals in accordance with this embodiment.

In this embodiment, as shown in FIG. 18, the shade of signal line conductors and other members on the sensing portions are made uniform irrespective of the position relative to the LED chips by the above-described mechanism, so that a uniform image signal output can be obtained during reading a black original as well as during reading a white original.

Figure 19:
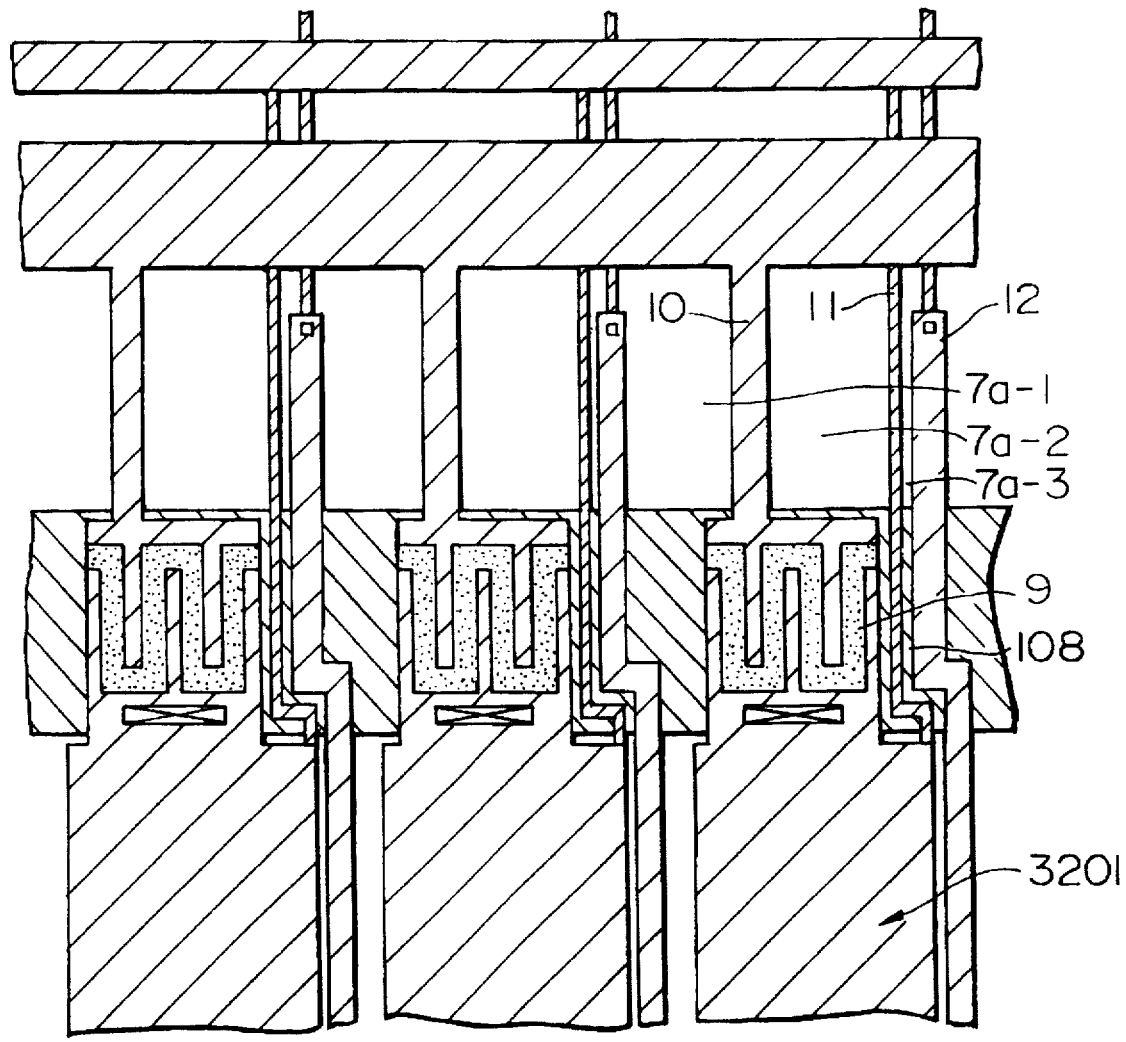
FIGS. 19, 20, and 21 are schematic diagrams of other preferred examples of the construction of the image reading device in accordance with the present invention.

The present invention is not limited to the configuration of the above-described embodiment. For example, the present invention can also be applied to a configuration, such as that shown in FIG. 19, in which the position of each window is shifted in the main scanning direction. In this case as well, the same effect of the present invention can be exhibited.

Figure 20:
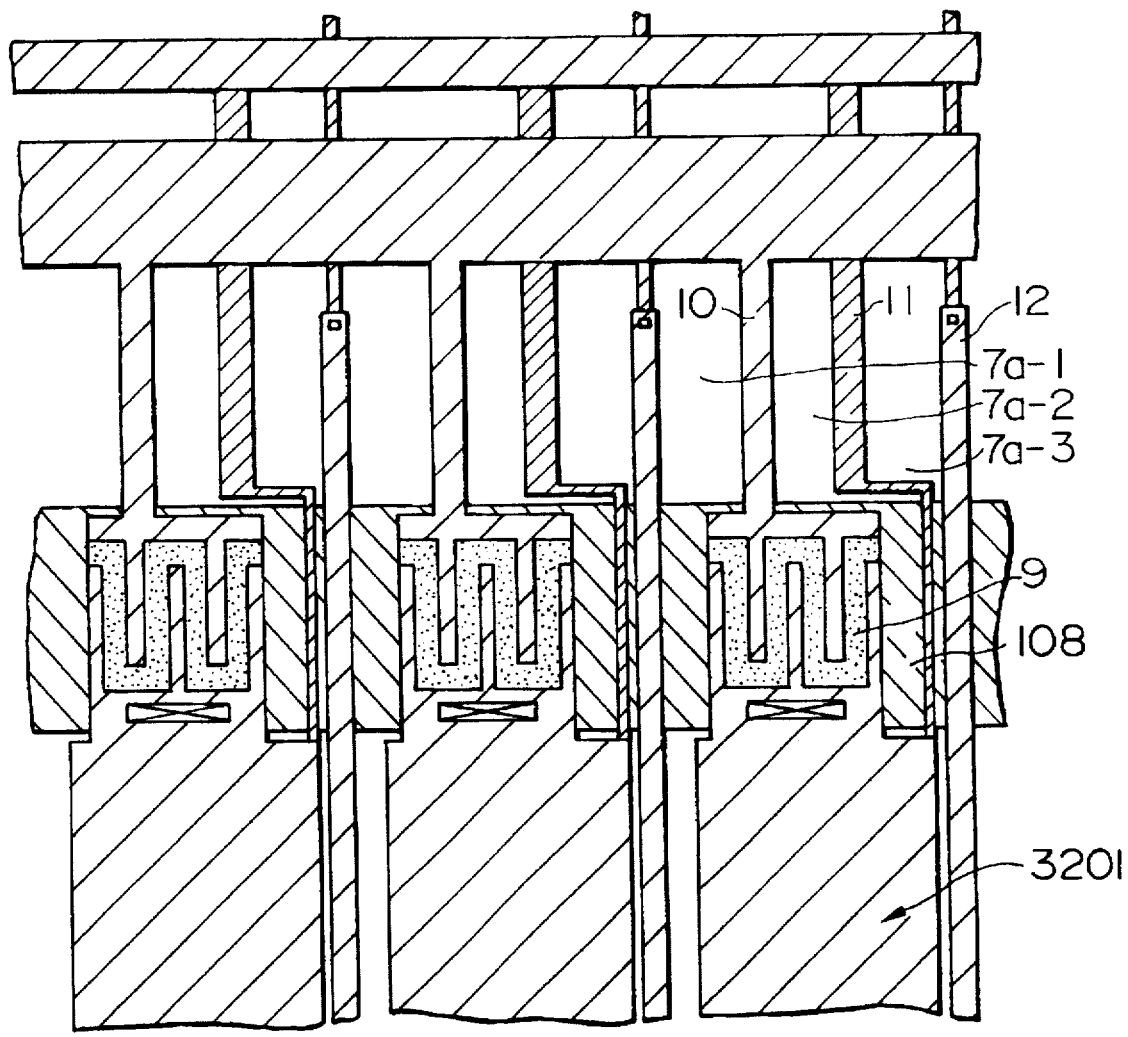

FIG. 20 shows an arrangement in which the lighting window corresponding to each photoelectric conversion element is sectioned in the main scanning direction into three portions having approximately equal widths. The same effect can also be achieved by this arrangement. In this case, source electrode conductor 10 and lead conductor 11 respectively define as shaded regions.

Figure 21:
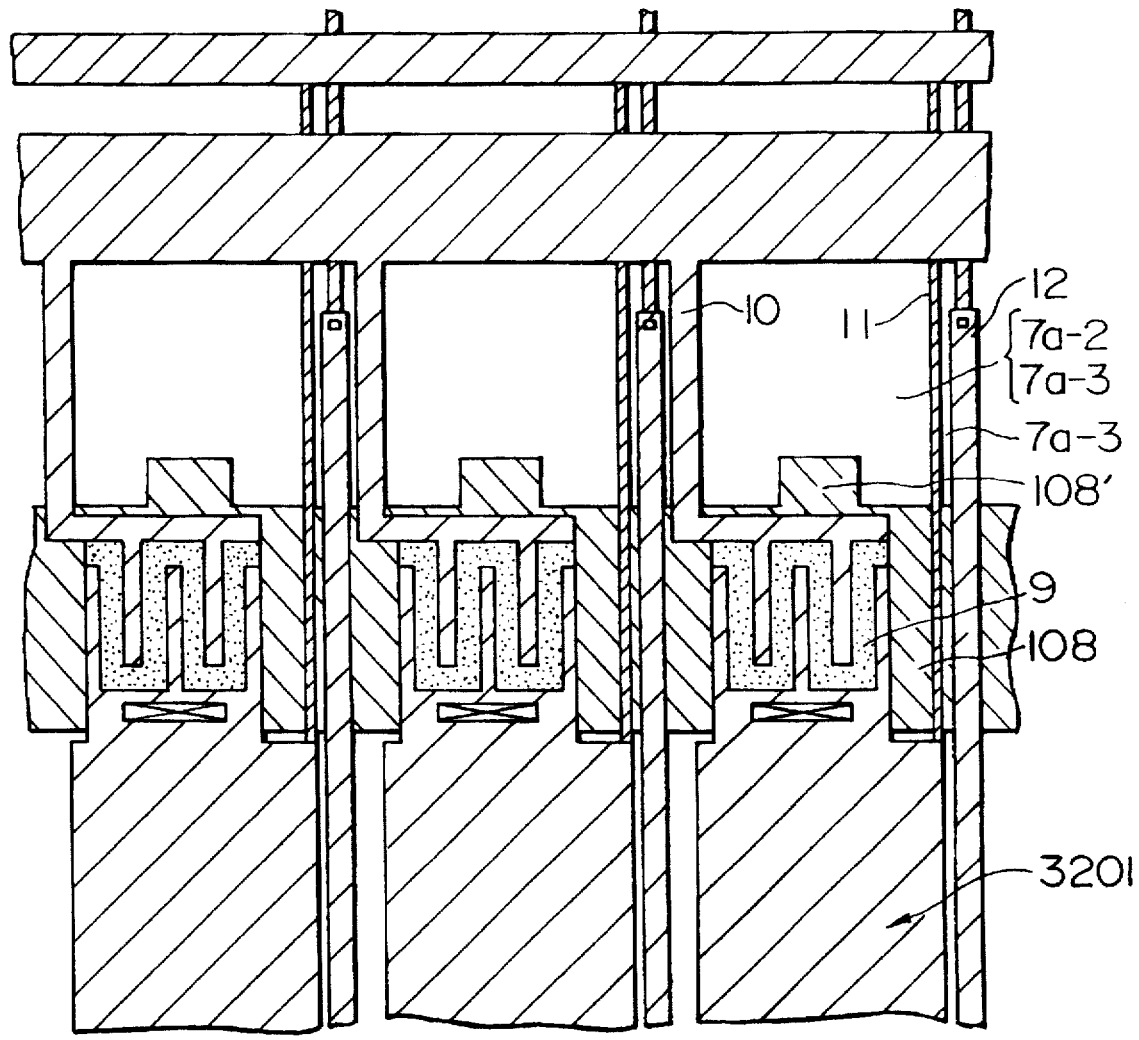

In accordance with the present invention, the same effect can also be achieved by shading only a portion of each lighting window whose image is formed on the sensing portion 9 of the photoelectric conversion element when projected onto the sensor surface at the time of reading a black original, i.e., by partially partitioning the lighting window, as shown in FIG. 21.

In this case, a portion of each light transmission area on the photoelectric conversion element side is sectioned into a plurality of regions by a shading portion 108' defining a shaded region, and the width of this region in the main scanning direction is selected to be smaller than the width of the sensing portion 9. Also the length of the shading portion 108' in the sub scanning direction is selected to be greater than the distance in the sub scanning direction through which the window image projected onto the sensor surface overlaps the sensing portion 9.

Preferably, the width of the shading portion 108' is equal or substantially equal to the sum of the widths of source electrode conductor 10, lead conductor 11 and signal line conductor 12. However, the shading portion 108' shown in FIG. 21 may have a width equal or substantially equal to the distance between one end of one lead conductor 11 (the left end as viewed in FIG. 21) and one end of near source electrode 10 (the right end as viewed in FIG. 21) if the gap between source electrode conductor 10 and signal line conductor 12 and the gap between the lead conductor 11 and signal line conductor 12 are vary small and negligible as a light transmission region.

Providing shading portion 108' at one side of each window alone as in this embodiment is advantageous in that the area of the portions shading the light for illuminating the original is reduced to enable high-luminance illumination, i.e., to minimize the reduction in the photoelectric conversion efficiency due to the existence of the shading portion 108'. In other words, the image reading device can be operated with reduced LEDs.

Figure 22:
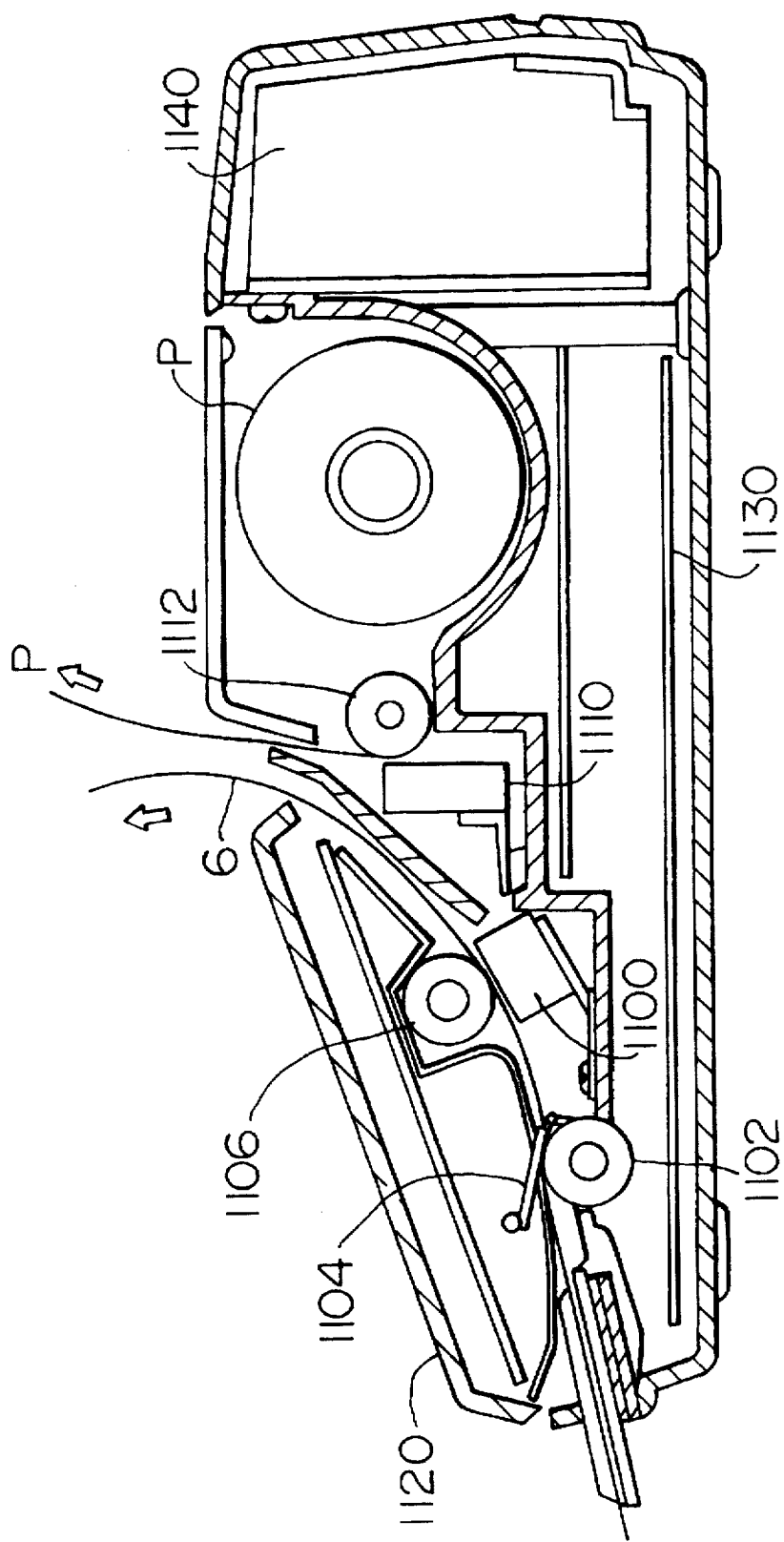
FIG. 22 is a schematic illustration of an information processor provided with the image reading device in accordance with the present invention.

FIG. 22 shows an example of a facsimile machine having a communication function and constructed as an image information processor by using an image reading device in accordance with the present invention. This facsimile machine has a feed roller 1102 provided as a means for feeding original 6 to a reading position, a separator piece 1104 for separating and feeding original sheets 6 one by one with reliability, and a platen roller 1106 provided as original support/transport means at the reading position on a sensor unit 1100 to control the position of the read surface of original 6 and to transport the same.

A recording medium P provided as a roll of paper in the illustrated example. Image information read with the sensor unit or image information transmitted from the outside in the case of using the facsimile function is reproduced on the recording medium P.

A recording head 1110 is provided as a recording means for an image based on this image information. Any type of head, e.g., a thermal head or an ink jet head can be used as recording head 1110. The recording head 1110 may be of a serial type or a line type. A platen roller 1112 is provided as a transport means for transporting recording medium P to the recording position on the recording head 1110 and for controlling the position of the recorded surface of recording medium P.

In an operation panel 1120, switches provided as input/output means for receiving operation inputs and a display for displaying messages and signs indicating the state of the machine are arranged.

A system control board 1130 is provided as a control means and has a controller for controlling each section of the machine, a drive circuit for driving photoelectric conversion elements, a processor for processing image information signals, and a transmission/reception section. A unit 1140 is a power source for the machine.

As the recording means for use in the information processor in accordance with the present invention, a recording system the typical construction and the principle of which are described in the specifications of U.S. Pat. Nos. 4,723, 129, and 4,740,796 is preferred. In this recording system, at least one driving signal is applied to each of the electrothermal conversion elements disposed in correspondence with a sheet or liquid paths in which a liquid (ink) is retained to cause an abrupt increase in temperature exceeding a nucleate boiling point in accordance with recording information, i.e., to generate thermal energy in the electrothermal conversion element to cause film boiling of the liquid (ink), so that a bubble can be formed in the liquid (ink) in a one-to-one relationship with this driving signal. This recording system can therefore be used effectively. The bubble is increased and reduced in volume so that the liquid (ink) is jetted to form at least one droplet.

A full-line type recording head may be used which has a length corresponding to the width of a maximum-size recording medium sheet available for recording in the recording unit. Such a head may have a construction, such as that described in the above-mentioned patent specifications, in which a plurality of recording heads are combined to cover the desired length, or the construction of one integrally-formed recording head.

The present invention is also effective when applied to a recording unit having an interchangeable chip-type recording head capable of being electrically connected to a main body of the apparatus and being supplied with ink from the unit body when attached to the unit body, or a cartridge type recording head integrally combined with an ink tank.

According to the present invention, as described above, an image reading device and an information processor using this image reading device can be provided in which a constant or substantially constant signal output range can be met with respect to reading black and white originals, and in which, preferably, signal outputs from photoelectric conversion elements are equal or substantially equal at the time of reading a white (or black) original.

According to the present invention, an image reading device and an information processor using this image reading device are provided which are designed to solve the above-described problem at a low cost (or without any substantial increase in manufacturing cost) and to meet design requirements with respect to size and power consumption.

The image reading device in accordance with the present invention can be manufactured by changing masks used in process of manufacturing the conventional image reading device without changing the overall design, so that the increase in the manufacturing cost can be minimized. In this respect, the image reading device of the present invention can be suitably reduced in manufacturing cost.

Further, according to the present invention, a low-cost image reading device for use in a close-contact type image reader using a pseudo linear light source such as an LED array can be provided which is capable of removing non-uniformity of an image signal output with accuracy at the time of reading a black original, and which is suitably used for high-precision half-tone reading.

The individual components shown in outline or designated by blocks in the drawings are all well-known in the image reading arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image reading device for reading an image of an original, said device comprising:

a plurality of photoelectric conversion elements disposed in an array in a first direction on a transparent substrate; and a plurality of windows disposed along said plurality of photoelectric conversion elements in an array having a one-to-one correspondence to said array of photoelectric conversion elements, for allowing an original that is to be read to be illuminated, wherein each of said plurality of windows is divided into two or more opening areas by a light-shielding member extending in a second direction, intersecting said first direction, on said transparent substrate.

2. An image reading device according to claim 1, wherein each said light-shielding member includes wiring patterns used for said image reading device.

3. An image reading device according to claim 1, wherein each said window includes a second light-shielding member for preventing unnecessary light from being incident on said photoelectric conversion elements, said light-shielding member extending from said second light-shielding member.

4. An image reading device according to claim 3, wherein said light-shielding member has the same or substantially the same width as said second light-shielding member.

5. An image reading device according to claim 4, wherein said light-shielding member includes a plurality of layers.

6. An image reading device according to claim 1, wherein each light-shielding member is disposed at an area including the center section of a respective one of said plurality of windows.

7. An image reading device according to claim 1, wherein each said light-shielding member contacts a respective one of said plurality of windows at a side closest to a corresponding one of said photoelectric conversion elements.

8. An image reading device according to claim 1, wherein each said light-shielding member contacts a respective one of said plurality windows at a side opposite to a corresponding one of said photoelectric conversion elements.

9. An image reading device according to claim 1, further comprising illumination means for illuminating the original to be read by said image reading device through said opening areas.

10. An image reading device according to claim 9, wherein said illumination means comprises at least one light emitting diode.

11. An image reading device according to claim 9, wherein said illumination means comprises a plurality of light emitting diodes.

12. An image reading device according to claim 11, wherein said light emitting diodes are disposed discretely.

13. An image reading device for reading an original, said device comprising:

a plurality of photoelectric conversion elements, each having a light receiving section, the photoelectric conversion elements being disposed in an array in a first direction on a transparent substrate;

a plurality of windows disposed along said plurality of photoelectric conversion elements in an array having a one-to-one correspondence to said array of photoelectric conversion elements, for allowing an original that is to be read to be illuminated, each of said plurality of windows having a light-shielding member extending within the window in a second direction which intersects said first direction; and a plurality of illumination light sources disposed in said first direction for illuminating the original to be read, wherein each of said plurality of windows is divided into two or more opening areas by said light-shielding member so as to uniformly or substantially uniformly illuminate the original to be read, by the light emitted from said illumination light sources.

14. An image reading device according to claim 13, wherein each said light-shielding member contacts a respective one of said plurality of windows at a side closest to a corresponding photoelectric conversion element.

15. An information processor comprising:

an image reading device for reading an original, said image reading device including a plurality of photoelectric conversion elements disposed in an array in a first direction, a plurality of windows disposed along said plurality of photoelectric conversion elements in an array having a one-to-one correspondence to said array of photoelectric conversion elements for illuminating the original, each of said plurality of windows having a light-shielding member disposed in a second direction which intersects said first direction, and a control circuit having a driving circuit for driving the image reading device and an image processing section for manipulating a signal from said image reading device;

illumination means for emitting light for illuminating the original; and original transporting means.

16. An information processor according to claim 15, wherein said light-shielding member includes wiring patterns used for said image reading device.

17. An information processor according to claim 15, wherein each said window includes a second light-shielding member for preventing unnecessary light from being incident on said photoelectric conversion elements, said light-shielding member extending from said second light-shielding member.

18. An information processor according to claim 17, wherein said light-shielding member has the same or substantially the same width as said second light-shielding member.

19. An information processor according to claim 18, wherein said light-shielding member includes a plurality of layers.

20. An information processor according to claim 15, wherein each said light-shielding member is disposed at an area including the center section of a respective one of said plurality of windows.

21. An information processor according to claim 15, wherein each said light-shielding member contacts a respective one of said plurality of windows at a side closest to a corresponding one of said photoelectric conversion elements.

22. An information processor according to claim 21, wherein each said light-shielding member contacts a respective one of said plurality windows at a side opposite to a corresponding one of said photoelectric conversion elements.

23. An information processor according to claim 15, wherein said illumination means comprises at least one light emitting diode.

24. An information processor according to claim 15, wherein said illumination means comprises a plurality of light emitting diodes.

25. An information processor according to claim 24, wherein said light emitting diodes are disposed discretely.

26. An information processor according to claim 15, further comprising recording means for recording image information corresponding to light received by the photoelectric converting elements.

27. An information processor according to claim 26, wherein said recording means comprises ink jet means for ejecting ink.

28. An information processor according to claim 27, wherein said ink jet means ejects ink by utilizing thermal energy.

29. An information processor comprising:

an image reading device for reading an original, said image reading device including a plurality of photoelectric conversion elements each having a light-receiving section, the photoelectric conversion elements being disposed in an array in a first direction on a transparent substrate, a plurality of windows disposed along said plurality of photoelectric conversion elements in an array for illuminating the original, and a plurality of illumination light sources disposed separately in said first direction, each of said plurality of windows having a light-shielding member extending within the window in a second direction which intersects said first direction so as to uniformly or substantially uniformly illuminate the surface of the original through said transparent substrate by light emitted from said plurality of illumination light sources, and a control circuit having a driving circuit for driving said image reading device and an image processing section for manipulating a signal from said image reading device; and means for transporting the original.

30. An information processor according to claim 29, wherein each of said light-shielding members is connected to at least one side in the second direction of each said window so as to be adjacent to a corresponding one of the photoelectric conversion elements.

31. An image reading device according to claim 29, wherein said windows are provided in a one-to-one relationship with said photoelectric conversion elements.

32. An information processor according to claim 29, further comprising recording means for recording information corresponding to the light received by the light receiving portions.

33. An information processor according to claim 32, wherein said recording means comprises ink jet means for ejecting ink.

34. An information processor according to claim 33, wherein said ink jet means ejects ink by utilizing thermal energy.

35. An image reading device for reading an image of an original, said image reading device comprising:

a transparent substrate;

a plurality of photoelectric conversion elements arranged in an array in a main scanning direction on said transparent substrate;

a plurality of windows having light transmitting sections, disposed in a one-to-one correspondence to said photoelectric conversion elements;

illumination means having a plurality of light-emitting sources, for illuminating the original to be read, disposed in said main scanning direction so as to emit light to illuminate the original through said light transmitting sections of said plurality of windows;

a plurality of light-shielding sections each extending in a subscanning direction which intersects said main scanning direction such that each of said light transmitting sections is divided into a plurality of light transmitting regions.

36. An image reading device according to claim 35, wherein each of said plurality of light transmitting regions is defined by a closed aperture.

37. An image reading device according to claim 35, wherein each of said plurality of light transmitting regions is a part of one continuous aperture.

38. An information processor comprising:

image reading means including a transparent substrate, a plurality of photoelectric conversion elements disposed in an array in a main scanning direction on said transparent substrate in a main scanning direction, a plurality of windows having light transmitting sections disposed in a one-to-one correspondence to said photoelectric conversion elements, and illumination means having a plurality of light-emitting sources disposed in said main scanning direction so as to emit light to illuminate an original through said light transmitting sections of said plurality of windows;

original support means for supporting the original at a reading position;

signal processing means for processing a signal output from said image reading means; and a plurality of light-shielding sections each extending in a subscanning direction which intersects said main scanning direction so that each of said light transmitting sections is divided into a plurality of light transmitting areas.

39. An information processor according to claim 38, further comprising recording means for recording image information.

40. An information processor according to claim 39, wherein said recording means comprises an ink jet recording head for ejecting ink by utilizing thermal energy.

* * * * *

UNITED STATES PATENT AND TRADEMARK OFFICE
CERTIFICATE OF CORRECTION

PATENT NO. : 5,717,502
DATED : February 10, 1998
INVENTOR(S) : TASUNDO KAWAI

It is certified that error appears in the above-identified patent and that said Letters Patent is hereby corrected as shown below:

<ins>IN THE DRAWINGS</ins>:

Sheet 17, Fig. 18, "PUTOUT" should read --OUTPUT--.

<ins>COLUMN 10</ins>

Line 26, "vary" should read --very--.

<ins>COLUMN 12</ins>

Line 52, "plurality" should read --plurality of--.

<ins>COLUMN 14</ins>

Line 3, "plurality" should read --plurality of--.

<ins>COLUMN 15</ins>

Line 8, "windows;" should read --windows; and--.

Signed and Sealed this

Twenty-ninth Day of September, 1998

Attest:

BRUCE LEHMAN

*Attesting Officer*    *Commissioner of Patents and Trademarks*